(12) United States Patent  (10) Patent No.: US 8,983,302 B2
Chan  (45) Date of Patent: Mar. 17, 2015

(54) TRANSCEIVER FOR PLASTIC OPTICAL FIBER NETWORKS

(75) Inventor: Eric Yuen-Jun Chan, Mercer Island, WA (US)

(73) Assignee: The Boeing Company, Chicago, IL (US)

( * ) Notice: Subject to any disclaimer, the term of this patent is extended or adjusted under 35 U.S.C. 154(b) by 791 days.

(21) Appl. No.: 12/612,968

(22) Filed: Nov. 5, 2009

(65) Prior Publication Data

US 2011/0103802 A1 May 5, 2011

(51) Int. Cl.
*H04B 10/00* (2013.01)
*H04B 10/06* (2006.01)
*H01L 31/0232* (2014.01)
*G02B 6/42* (2006.01)
*H01L 31/108* (2006.01)
*H04B 10/40* (2013.01)

(52) U.S. Cl.
CPC ........ *H01L 31/02325* (2013.01); *G02B 6/4201* (2013.01); *G02B 6/4246* (2013.01); *H01L 31/108* (2013.01); *H04B 10/40* (2013.01)
USPC ............ 398/138; 398/135; 398/140; 398/202

(58) Field of Classification Search
CPC ...... H04B 10/272; H04B 10/40; H04B 10/43; H04B 10/50; H04B 10/501; H04B 10/502; H04B 10/60; H04B 10/69; H04B 10/691; H04B 10/697; H04B 10/0408; H04B 10/10; H04B 10/38
See application file for complete search history.

(56) References Cited

U.S. PATENT DOCUMENTS

| 3,688,396 | A | * | 9/1972 | Kilby et al. | 29/847 |
| 4,659,170 | A | * | 4/1987 | Wittke | 398/182 |
| 4,709,416 | A | * | 11/1987 | Patterson | 398/197 |
| 4,771,415 | A | * | 9/1988 | Taki | 369/112.27 |
| 5,010,018 | A | | 4/1991 | Polasko et al. | |
| 5,091,642 | A | * | 2/1992 | Chow et al. | 250/226 |
| 5,144,381 | A | | 9/1992 | Furuyama et al. | |

(Continued)

FOREIGN PATENT DOCUMENTS

EP 1202480 A2 5/2002
JP 57030381 A 2/1982

(Continued)

OTHER PUBLICATIONS

U.S. Appl. No. 12/612,941, filed Nov. 5, 2009, Chan.

(Continued)

*Primary Examiner* — Darren E Wolf
(74) *Attorney, Agent, or Firm* — Yee & Associates, P.C.

(57) ABSTRACT

An apparatus comprises an optical transmitter; an optical detector configured to receive optical signals from an optical fiber; an optical splitter having a first port, a second port coupled to the optical detector by the optical fiber, and a third port coupled to the optical transmitter; and a two stage amplifier system connected to an output of the optical detector. An input surface of the optical detector may have a diameter that is substantially equal to a diameter of a core in the optical fiber. The diameter of the input surface of the optical detector reduces capacitance and reduces signal distortion. The optical splitter may be configured to receive a first optical signal at the first port. The optical splitter may be configured to send the first optical signal to the second port and send a second optical signal received at the third port to the first port.

24 Claims, 12 Drawing Sheets

(56) References Cited

U.S. PATENT DOCUMENTS

| | | | |
|---|---|---|---|
| 5,200,631 A * | 4/1993 | Austin et al. | 257/570 |
| 5,285,512 A | 2/1994 | Duncan et al. | |
| 5,594,237 A | 1/1997 | Kulick et al. | |
| 5,859,464 A | 1/1999 | Hollricher et al. | |
| 6,262,465 B1 * | 7/2001 | Williamson et al. | 257/458 |
| 6,441,937 B1 | 8/2002 | Baur et al. | |
| 6,595,708 B1 * | 7/2003 | Yamashita | 398/202 |
| 6,623,180 B2 * | 9/2003 | Panicker et al. | 385/92 |
| 6,704,515 B1 * | 3/2004 | Chan et al. | 398/116 |
| 6,924,541 B2 | 8/2005 | Yoneda et al. | |
| 7,503,706 B2 | 3/2009 | Wipiejewski et al. | |
| 2002/0020892 A1 | 2/2002 | Shima | |
| 2003/0101575 A1 * | 6/2003 | Green et al. | 29/720 |
| 2006/0001493 A1 * | 1/2006 | Harms et al. | 330/308 |
| 2007/0194357 A1 * | 8/2007 | Oohashi et al. | 257/292 |
| 2008/0308888 A1 | 12/2008 | Lee | |
| 2010/0019343 A1 | 1/2010 | Ellis et al. | |
| 2010/0270638 A1 | 10/2010 | Ahn | |
| 2011/0101485 A1 | 5/2011 | Chan | |

FOREIGN PATENT DOCUMENTS

| | | |
|---|---|---|
| JP | 2003273392 A | 9/2003 |
| WO | 8805234 | 7/1988 |
| WO | 0206877 A2 | 1/2002 |

OTHER PUBLICATIONS

Stach et al., "Bidirectional Optical Interconnection at Gb/s Data Rates with Monolithically Integrated VCSEL-MSM Transceiver Chips", IEEE Photonics Technology Letters, IEEE Service Center, Piscataway NJ, vol. 18 No. 22, Nov. 15, 2006, pp. 2386-2388.

Nieweglowski et al., "Demonstration of board-level optical link with ceramic optoelectronic multi-chip module", 59th IEEE Electronic Components and Technology Conference, 2009, ECTC 2009, May 26, 2009, Piscataway NJ, pp. 1879-1886.

PCT Search Report dated Sep. 14, 2011 regarding International application No. PCT/US2010/051523.

Maxim 155Mbps Low-Noise Transimpedance Amplifier, Maxim Integrated Products, pp. 1-15, 19-2834, Rev 3, Nov. 2005.

Maxim 200Mbps SFP Limiting Amplifier, Maxim Integrated Products, pp. 1-11, 19-3251, Rev 1, Jun. 2006.

Maxim 270Mbps SFP LED Driver, Maxim Integrated Products, pp. 1-14, 19-3252, Rev 0, May 2004.

"Si PIN photodiode S5971, S5972, S5973 series" Hamamatsu Photonics, pp. 1-4, retrieved Oct. 30, 2009 www.hamamatsu.com.

Red LED L10762, Resonant cavity LED for POF data communication, pp. 1-3, retrieved Oct. 30, 2009 www.hamamatsu.com.

ZL60003 RCLED 650 nm, Plastic Optical Fiber Communications—125 to 250 Mbps Data Sheet, Zarlink semiconductor Inc, 2003-2004, pp. 1-4 www.zarlink.com.

Toyota CRDL Demonstrates Inexpensive Bidrectional Fiber Communications:, pp. 1-2, Oct. 1, 2005 http://www.photonics.com/Content/ReadArticle.aspx?ArticleID=23050.

"1mm polymer optical fiber (POF) splitter", 1 page, retrieved Feb. 19, 2009 www.diemount.com.

"Eska High Performance Plastic Optical Fiber", Mitsubishi Rayon Co, 2002, Korea, pp. 1-7 http://www.kwangwo.co.kr/down/fiboptic/ESKA.pdf.

Office Action dated Jan. 4, 2013, regarding U.S. Appl. No. 12/612,941, 27 pages.

Office Action, dated Sep. 25, 2013, regarding U.S. Appl. No. 12/612,941, 21 pages.

Howell et al., "Principles, Application, and Selection of Receiving Diodes", M/A-COM Semiconductor Products Division, 1987, 6 pages.

Office Action, dated Aug. 1, 2014, regarding U.S. Appl. No. 12/612,941, 26 pages.

Office Action, dated Apr. 24, 2014, regarding U.S. Appl. No. 12/612,941, 26 pages.

* cited by examiner

TRANSCEIVER FOR PLASTIC OPTICAL FIBER NETWORKS

CROSS REFERENCE TO RELATED APPLICATION

The present disclosure is related to the following patent application: entitled "Detector for Plastic Optical Fiber Networks", Ser. No. 12/612,941; filed even date hereof, assigned to the same assignee, and incorporated herein by reference.

BACKGROUND INFORMATION

1. Field

The present disclosure relates generally to fiber optics and, in particular, to a method and apparatus for transmitting optical signals over optical fibers. Still more particularly, the present disclosure relates to a method and apparatus for a transceiver used with plastic optical fibers in a network in an aircraft.

2. Background

Information may be transmitted in the form of signals using a number of different types of mediums. Optical fibers are one type of medium for transmitting signals in networks. In particular, optical fibers may be used to transmit signals in long-distance communications networks. Optical fibers allow the transmission of signals over greater distances and at higher bandwidths as compared to other types of mediums, such as, for example, metal wires. Signals travel through optical fibers with reduced power loss as compared to signals traveling through metal wires. Further, optical fibers are also immune to electromagnetic interference.

The materials used in optical fibers are typically selected from one of glass and plastic. The physical properties of glass make the use of glass optical fibers (GOFs) in optical networks desirable in many cases. For example, glass optical fibers experience less signal loss over a given distance than plastic optical fiber (POF). Networks using glass optical fibers are desirable for long distance communication networks. Signal loss becomes a greater concern as the distance over which an optical signal travels increases.

For example, optical signals sent over a network using glass optical fibers operate at the near infra-red (IR) wavelength range of about 1300 nanometers to 1550 nanometers. At these wavelengths, glass optical fibers experience a loss of about 0.2 decibels per kilometer. In contrast, optical signals sent through plastic optical fibers operate in the red wavelength range of about 650 nanometers. At this wavelength, optical signals through plastic optical fibers experience a loss of about 150 decibels per kilometer. Thus, the loss that occurs with optical signals traveling through plastic optical fibers is over two orders of magnitude higher than glass optical fiber signal loss.

Despite these advantages, the use of glass optical fibers also has disadvantages as compared to plastic optical fibers. Glass optical fibers are more fragile than plastic optical fibers. Glass optical fibers may be also more likely to break during installation of these types of fibers.

Glass optical fibers are more expensive than plastic optical fibers. Further, components used in networks with glass optical fibers may be more expensive than components used in networks with plastic optical fibers. As a result, the use of glass optical fibers in networks may increase costs of installing and/or replacing glass optical fibers. Accordingly, it would be advantageous to have a method and apparatus, which takes into account one or more of the issues discussed above as well as possibly other issues.

SUMMARY

In one advantageous embodiment, an apparatus comprises an optical transmitter, an optical detector, an optical splitter, and a two stage amplifier system. The optical detector may be configured to receive optical signals from an optical fiber. An input surface of the optical detector may have a diameter that is substantially equal to a diameter of a core in the optical fiber. The diameter of the input surface of the optical detector may reduce capacitance and may reduce signal distortion. The optical splitter may have a first port, a second port coupled to the optical detector by the optical fiber, and a third port coupled to the optical transmitter. The optical splitter may be configured to receive a first optical signal at the first port. The optical splitter may be also configured to send the first optical signal to the second port and send a second optical signal received at the third port to the first port. The two stage amplifier system may be connected to an output of the optical detector.

In another advantageous embodiment, an apparatus comprises an optical detector configured to receive optical signals from a plastic optical fiber and a two stage amplifier system connected to an output of the optical detector to form an optical receiver. An input surface of the optical detector may have a diameter that is substantially equal to a diameter of a core in the plastic optical fiber. The diameter of the input surface of the optical detector may reduce capacitance and may reduce signal distortion. The optical receiver may have a sensitivity having a value of equal to or less than about −32 decibel milliwatts.

In yet another advantageous embodiment a method for processing optical signals is present. A first optical signal may be received from an optical fiber at an input surface of an optical detector. The input surface of the optical detector may have a diameter that is substantially equal to a diameter of a core in the optical fiber. The diameter of the input surface of the optical detector may reduce capacitance and may reduce signal distortion. An electrical signal may be sent from the optical detector to a two stage amplifier system connected to an output of the optical detector. The optical detector and the two stage amplifier system may be connected to the output of the optical detector form an optical receiver. The optical receiver may a sensitivity having a value equal to or less than about −32 decibel milliwatts.

In still yet another advantageous embodiment, an apparatus comprises a substantially planar insulating structure, an optical splitter, an optical detector, and an optical transmitter. The optical splitter may have a first port, a second port located on a first surface of the substantially planar insulating structure, and a third port located on a second surface of the substantially planar insulating structure. The optical splitter may be configured to receive a first optical signal at the first port. The optical splitter may be configured to send the first optical signal received at the first port to the second port and send a second optical signal received at the third port to the first port. The optical detector may be located on the first surface of the substantially planar insulating structure and coupled to the second port. The optical transmitter may be located on the second surface of the substantially planar insulating structure and coupled to the third port. The first surface may be substantially opposite to the second surface.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

Figure 1:
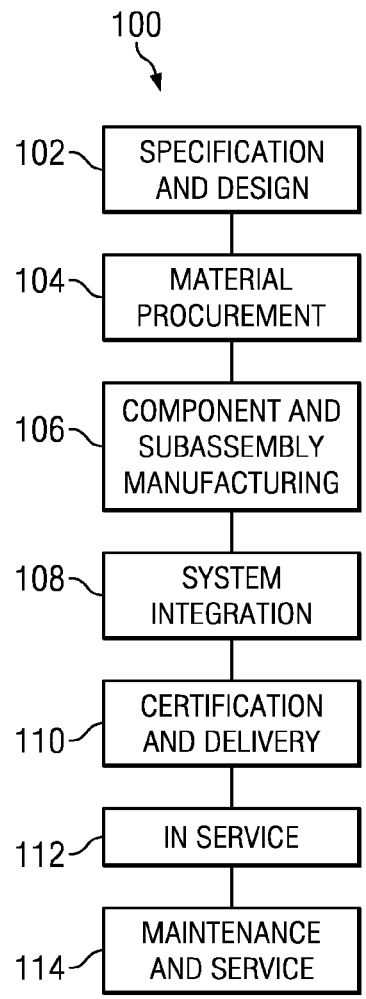
FIG. 1 is an illustration of an aircraft manufacturing and service method in accordance with an advantageous embodiment.
Figure 2:
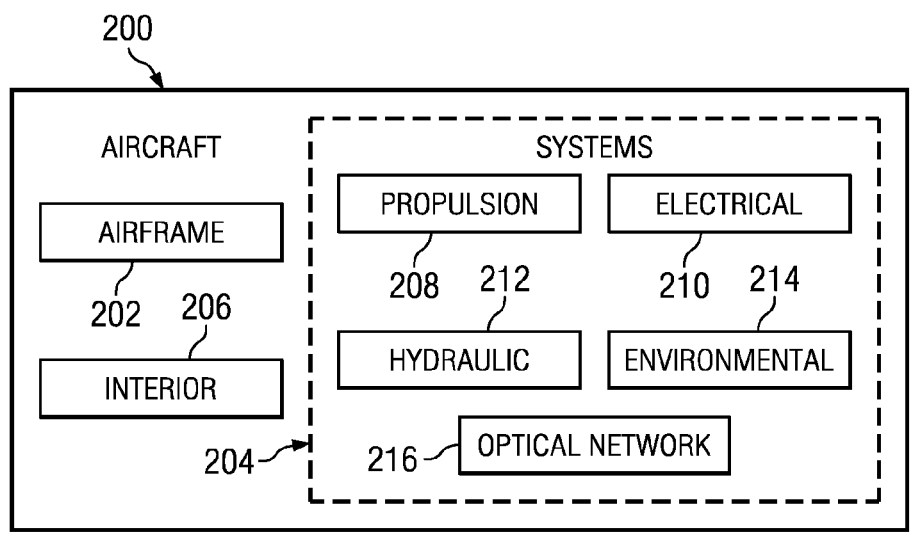
FIG. 2 is an illustration of an aircraft in which an advantageous embodiment may be implemented.

Referring more particularly to the drawings, embodiments of the disclosure may be described in the context of aircraft manufacturing and service method 100 as shown in FIG. 1 and aircraft 200 as shown in FIG. 2. Turning first to FIG. 1, an illustration of an aircraft manufacturing and service method is depicted in accordance with an advantageous embodiment. During pre-production, aircraft manufacturing and service method 100 may include specification and design 102 of aircraft 200 in FIG. 2 and material procurement 104.

During production, component and subassembly manufacturing 106 and system integration 108 of aircraft 200 in FIG. 2 takes place. Thereafter, aircraft 200 in FIG. 2 may go through certification and delivery 110 in order to be placed in service 112. While in service by a customer, aircraft 200 in FIG. 2 is scheduled for routine maintenance and service 114, which may include modification, reconfiguration, refurbishment, and other maintenance or service.

Each of the processes of aircraft manufacturing and service method 100 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of venders, subcontractors, and suppliers; and an operator may be an airline, leasing company, military entity, service organization, and so on.

With reference now to FIG. 2, an illustration of an aircraft is depicted in which an advantageous embodiment may be implemented. In this example, aircraft 200 is produced by aircraft manufacturing and service method 100 in FIG. 1 and may include airframe 202 with plurality of systems 204 and interior 206. Examples of systems 204 include one or more of propulsion system 208, electrical system 210, hydraulic system 212, and environmental system 214, and optical network 216. Any number of other systems may be included. Although an aerospace example is shown, different advantageous embodiments may be applied to other industries, such as the automotive industry.

Apparatus and methods embodied herein may be employed during at least one of the stages of aircraft manufacturing and service method 100 in FIG. 1. As used herein, the phrase "at least one of", when used with a list of items, means that different combinations of one or more of the listed items may be used and only one of each item in the list may be needed. For example, "at least one of item A, item B, and item C" may include, for example, without limitation, item A or item A and item B. This example also may include item A, item B, and item C or item B and item C.

In one illustrative example, components or subassemblies produced in component and subassembly manufacturing 106 in FIG. 1 may be fabricated or manufactured in a manner similar to components or subassemblies produced while aircraft 200 is in service 112 in FIG. 1. As yet another example, a number of apparatus embodiments, method embodiments, or a combination thereof may be utilized during production stages, such as component and subassembly manufacturing 106 and system integration 108 in FIG. 1.

A number, when referring to items means, one or more items. For example, a number of apparatus embodiments is one or more apparatus embodiments. A number of apparatus embodiments, method embodiments, or a combination thereof may be utilized while aircraft 200 is in service 112 and/or during maintenance and service 114 in FIG. 1. The use of a number of the different advantageous embodiments may substantially expedite the assembly of and/or reduce the cost of aircraft 200.

A first component may considered to be associated with a second component by being secured to the second component, bonded to the second component, fastened to the second component, and/or connected to the second component in some other suitable manner. The first component also may be connected to the second component through using a third component. The first component may also be considered to be associated with the second component by being formed as part of and/or an extension of the second component.

The different advantageous embodiments recognize and take into account a number of different considerations. For example, the different advantageous embodiments recognize and take into account that many currently available long-distance networks use glass optical fibers to transmit information. However, the different advantageous embodiments recognize that plastic optical fibers have a greater durability as compared to glass fibers. One solution may involve replacing glass optical fibers with plastic optical fibers. However, with plastic optical fibers, signal loss increases as the distance over which the signal travels increases. The different advantageous embodiments recognize that as a result of this signal loss, errors may occur while transmitting information through plastic optical fibers.

Further, the different advantageous embodiments also recognize and take into account that components used in networks configured for the use of glass optical fibers may not have a desired level of sensitivity for use with plastic optical fibers. More specifically, the use of plastic optical fibers in networks may require that the components in the networks have a greater level of sensitivity as compared to the use of glass optical fibers. One solution may involve using components that are currently configured for use with plastic optical fibers. However, the different advantageous embodiments recognize and take into account that these components may not provide the desired level of sensitivity for transmitting information over distances of about 30 meters or greater without error.

Thus, the different advantageous embodiments provide a method and apparatus for a transceiver for networks with plastic optical fibers. In one advantageous embodiment, an apparatus comprises an optical transmitter; an optical detector configured to receive optical signals from an optical fiber; an optical splitter having a first port, a second port coupled to the optical detector by the optical fiber, and a third port coupled to the optical transmitter; and a two stage amplifier system connected to an output of the optical detector. An input surface of the optical detector has a diameter that is substantially equal to a diameter of a core in the optical fiber. The diameter of the input surface of the optical detector reduces capacitance and reduces signal distortion. The optical splitter is configured to receive a first optical signal at the first port. The optical splitter is configured to send the first optical signal to the second port and send a second optical signal received at the third port to the first port.

Figure 3:
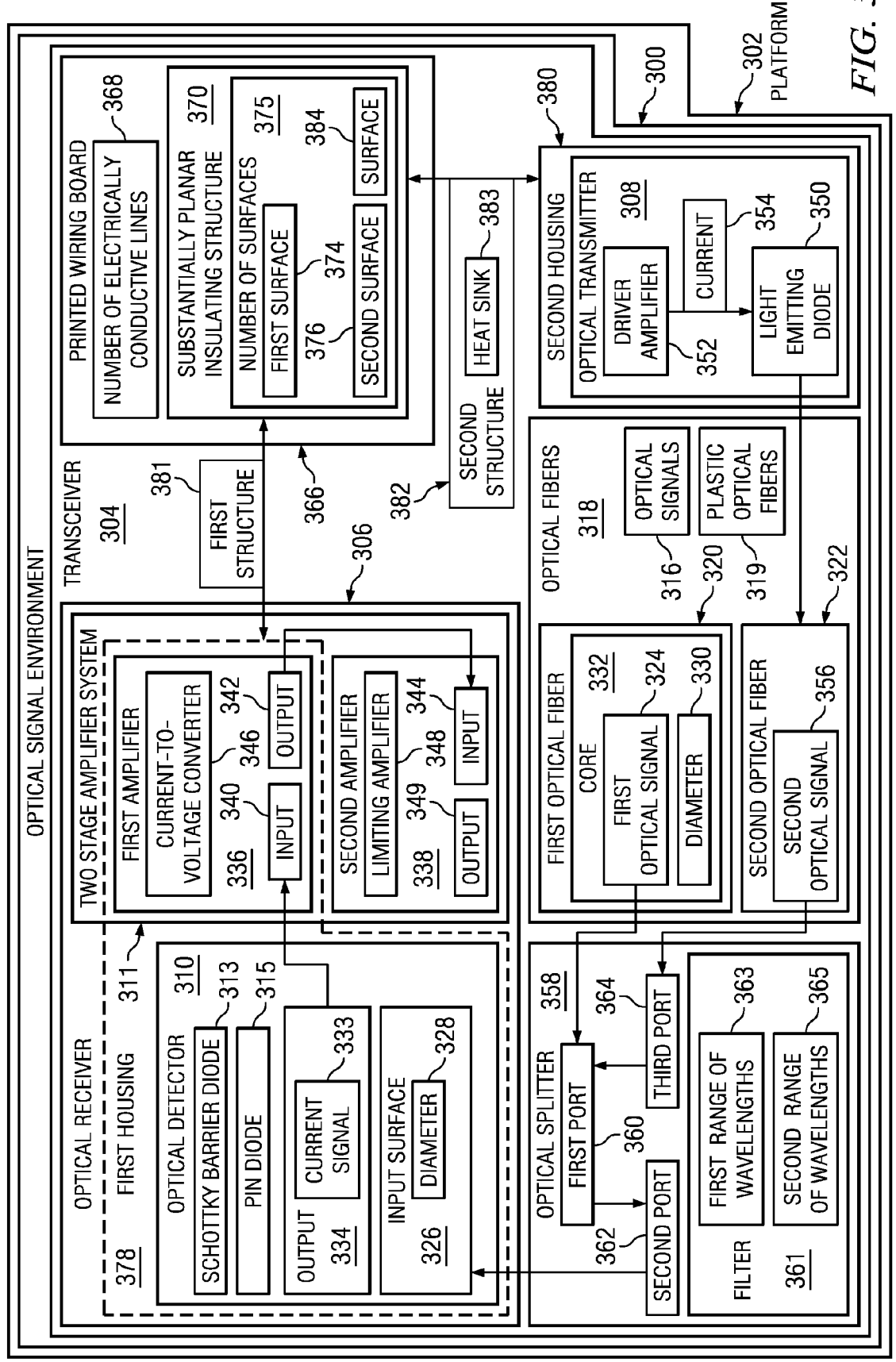
FIG. 3 is an illustration of an optical signal environment in accordance with an advantageous embodiment.

With reference now to FIG. 3, an illustration of an optical signal environment is depicted in accordance with an advantageous embodiment. In this illustrative example, optical signal environment 300 may be implemented in a network such as, for example, optical network 216 in FIG. 2. Further, optical signal environment 300 may be implemented in platform 302. In this depicted example, platform 302 takes the form of aircraft 200 in FIG. 2. Optical signal environment 300 may be comprised of a number of components used to transmit information. In this illustrative example, optical signal environment 300 includes transceiver 304. Transceiver 304 includes optical receiver 306 and optical transmitter 308. As depicted, optical receiver 306 is coupled to optical transmitter 308.

As used herein, a first component may considered to be coupled to a second component by being secured to the second component, bonded to the second component, fastened to the second component, and/or connected to the second component in some other suitable manner. The first component also may be coupled to the second component through using a third component. The first component may also be considered to be coupled to the second component by being formed as part of and/or an extension of the second component. Also as used herein, optical components may be coupled to other components. When optical components are coupled to other components there may be a small gap between the components.

In these illustrative examples, optical receiver 306 includes optical detector 310 and two stage amplifier system 311. Optical detector 310 may take the form of, Schottky barrier diode 313, PIN diode 315, or some other suitable type of optical detector. For example, PIN diode 315 may be a diode having a p-type layer on an intrinsic layer on an n-type layer.

Optical detector 310 is configured to receive optical signals 316 traveling through optical fibers 318 in this example. In these illustrative examples, optical signals 316 may be directly received or indirectly received by optical detector 310. As used herein, "directly received" means without being sent or received by an additional component, and "indirectly received" means being sent or received by at least one additional component.

In these illustrative examples, optical fibers 318 take the form of plastic optical fibers 319. In other advantageous embodiments, optical fibers 318 may take the form of glass optical fibers and/or some other suitable type of optical fiber. Optical fibers 318 include first optical fiber 320 and second optical fiber 322 in this example.

Optical detector 310 may receive first optical signal 324 traveling through first optical fiber 320 at input surface 326 of optical detector 310. In this illustrative example, input surface 326 has diameter 328. Diameter 328 is selected such that diameter 328 is substantially the same as diameter 330 of core 332 in first optical fiber 320. Core 332 is the portion of first optical fiber 320 through which first optical signal 324 travels.

First optical signal 324 is received at input surface 326 of optical detector 310 as photons traveling through core 332 of first optical fiber 320. These photons enter input surface 326 of optical detector 310 and generate photoelectrons in optical detector 310. These photoelectrons in turn produce current signal 333 at output 334 of optical detector 310.

By having diameter 328 of input surface 326 and diameter 330 of core 332 be substantially the same, signal loss for first optical signal 324 at optical detector 310 may be reduced. For example, an optical detector with an input surface that is smaller than core 332 of first optical fiber 320 may not receive all of the photons traveling in first optical signal 324. This smaller input surface also may lead to distortion of current signal 333 generated by the optical detector. On the other hand, using an optical detector with an input surface having a diameter that is larger than the diameter of core 332 of first optical fiber 320 increases capacitance of the optical detector. The increased capacitance may cause a time delay and distortion of the signal generated by an optical detector reducing sensitivity of the optical detector and the optical receiver.

By having diameter 328 of input surface 326 and diameter 330 of core 332 be substantially the same, signal distortion of current signal 333 and capacitance of optical detector 310 may be reduced. As a result, a level of sensitivity of optical receiver 306 may be increased.

As depicted in this example, current signal 333 is output through output 334 and received by two stage amplifier system 311 in optical receiver 306. In these illustrative examples, two stage amplifier system 311 amplifies current signal 333 received to increase a level of sensitivity of transceiver 304. Two stage amplifier system 311 may include first amplifier 336, second amplifier 338, and/or other suitable components. First amplifier 336 has input 340 of first amplifier 336 connected to output 334 of optical detector 310. Current signal 333 is received at input 340 of first amplifier 336. Output 342 of first amplifier 336 is connected to input 344 of second amplifier 338. As used herein, a first component may be connected to a second component through using a third component. The first component may also be considered to be connected to the second component by being formed as part of, and/or an extension of, the second component. Further, components may be electrically connected using bonding, soldering, wiring and/or any other suitable electrical connection.

In this illustrative example, first amplifier 336 takes the form of current-to-voltage converter 346. Current-to-voltage converter 346 may also be referred to as a transimpedance amplifier. Current-to-voltage converter 346 has a gain equal to a feedback resistance. Output 342 of current-to-voltage converter 346 is connected to input 344 of second amplifier 338.

In this depicted example, second amplifier 338 takes the form of limiting amplifier 348. Limiting amplifier 348 reduces and/or limits variations in power in the voltage signal received at input 344 from output 342. Limiting amplifier 348 provides a substantially constant output signal at output 349 of limiting amplifier 348 over a range of input voltage signals. In these examples, current-to-voltage converter 346 and limiting amplifier 348 are selected to match the gain and noise requirements of optical detector 310.

In these illustrative examples, optical transmitter 308 includes light emitting diode 350 and driver amplifier 352. Driver amplifier 352 sends current 354 to bias light emitting diode 350. Light emitting diode 350 emits light waves that form second optical signal 356. Second optical signal 356 may be transmitted from optical transmitter 308 and travel through second optical fiber 322 in optical fibers 318. In this depicted example, light emitting diode 350 may be a green light emitting diode, a red light emitting diode, a blue light emitting diode, or some other type of light source suitable for transmitting optical signals.

As depicted in these illustrative examples, transceiver 304 may also include optical splitter 358. Optical splitter 358 has first port 360, second port 362, and third port 364. In these illustrative examples, optical splitter 358 is bi-directional. In other words, optical splitter 358 may both receive and send optical signals. For example, first port 360 of optical splitter 358 is bi-directional. In other words, optical signals may be sent from, and received by, first port 360 of optical splitter 358.

In this illustrative example, first port 360 receives first optical signal 324 traveling through first optical fiber 320. First port 360 also sends first optical signal 324 to second port 362. Second port 362 sends first optical signal 324 traveling through first optical fiber 320 to input surface 326 of optical detector 310. Third port 364 receives second optical signal 356 from optical transmitter 308 and sends second optical signal 356 to first port 360.

In this depicted example, optical splitter 358 includes filter 361. Filter 361 may receive first optical signal 324 traveling through first optical fiber 320. Filter 361 allows first range of wavelengths 363 of first optical signal 324 to pass to first port 360 and/or second port 362 of optical splitter 358. Further, filter 361 may receive second optical signal 356 from third port 364. Filter 361 reflects second range of wavelengths 365 of second optical signal 356 to first port 360 and/or second port 362. In other advantageous embodiments, filter 361 may reflect first range of wavelengths 363 of first optical signal 324 and allow second range of wavelengths 365 to pass.

As depicted in these examples, transceiver 304 also includes printed wiring board 366. Printed wiring board 366 may be comprised of number of electrically conductive lines 368, substantially planar insulating structure 370, and/or other suitable components. Substantially planar insulating structure 370 is a structure made of a material that is substantially non-conductive with respect to electrical signals or current. Substantially planar insulating structure 370 has number of surfaces 375.

Number of surfaces 375 includes first surface 374 and second surface 376. First surface 374 and second surface 376 may be substantially opposite to each other in this depicted example. In these illustrative examples, optical detector 310 may be located on first surface 374 of substantially planar insulating structure 370. Optical detector 310 may be connected directly to substantially planar insulating structure 370 in this example. Further, optical transmitter 308 may be located on second surface 376 of substantially planar insulating structure 370. Optical transmitter 308 may also be connected directly to substantially planar insulating structure 370. As used herein, "directly connected to" means being attached, secured, bonded and/or connected to without an additional component, and "indirectly connected to" means being attached, secured, bonded, and/or connected to by at least one additional component.

In some advantageous embodiments, optical detector 310 may be located in first housing 378. First housing 378 may be connected to first surface 374 of substantially planar insulating structure 370 directly or indirectly by first structure 381. Further, in these advantageous embodiments, optical transmitter 308 may be located in second housing 380. Second housing 380 may be connected to second surface 376 of substantially planar insulating structure 370 directly or indirectly through second structure 382. Second structure 382 may take the form of heat sink 383 in these examples. First housing 378 and second housing 380 may be hermetically sealed containers. For example, without limitation, first housing 378 and second housing 380 may be hermetically sealed TO-18 or TO-46 can with a glass window or semi-spherical lensed cap. These components may be commercially available from Independent Business and Scientific Group Company Limited.

In these advantageous embodiments, first housing 378 may also house first amplifier 336 of two stage amplifier system 311. Second amplifier 338 of two stage amplifier system 311 may be located outside of first housing 378 on surface 384 of substantially planar insulating structure 370. In these examples, surface 384 may be first surface 374. In other examples, surface 384 may be second surface 376 or some other suitable surface in number of surfaces 375. In yet other advantageous embodiments, both first amplifier 336 and second amplifier 338 may be located outside of first housing 378 on surface 384 of substantially planar insulating structure 370. In still other advantageous embodiments, first amplifier 336 and second amplifier 338 may be located on different surfaces in number of surfaces 375.

The illustration of optical signal environment 300 in FIG. 3 is not meant to imply physical or architectural limitations to the manner in which different advantageous embodiments may be implemented. Other components, in addition to and/or in place of the ones illustrated, may be used. Some components may be unnecessary in some advantageous embodiments. Also, the blocks are presented to illustrate some functional components. One or more of these blocks may be combined and/or divided into different blocks when implemented in different advantageous embodiments.

For example, in other advantageous embodiments, transceiver 304 may include additional optical receivers and/or optical transmitters in addition to optical receiver 306 and/or optical transmitter 308. Further, in some advantageous embodiments, optical signal environment 300 may include additional transceivers in addition to transceiver 304 or any additional number of optical receivers, optical transmitters, optical splitters, and/or other suitable components.

In still other advantageous embodiments, optical signal environment 300 may have optical signals 316 traveling on optical fibers 318 in addition to first optical fiber 320 and second optical fiber 322. In some examples, optical splitter 358 may not include filter 361. In yet other advantageous embodiments, first port 360 and/or third port 364 may be configured to receive optical signals 316 traveling through mediums other than optical fibers 318.

In other advantageous embodiments, platform 302 may take other forms. In the illustrative examples, platform 302 may be a mobile platform, a stationary platform, a land-based structure, an aquatic-based structure, a space-based structure, an aircraft, a submarine, a bus, a personnel carrier, a tank, a train, an automobile, a spacecraft, a space station, a satellite, a bridge, a dam, a surface ship, and/or some other suitable platform. Optical signal environment 300 may be implemented in any number of these platforms.

Figure 4:
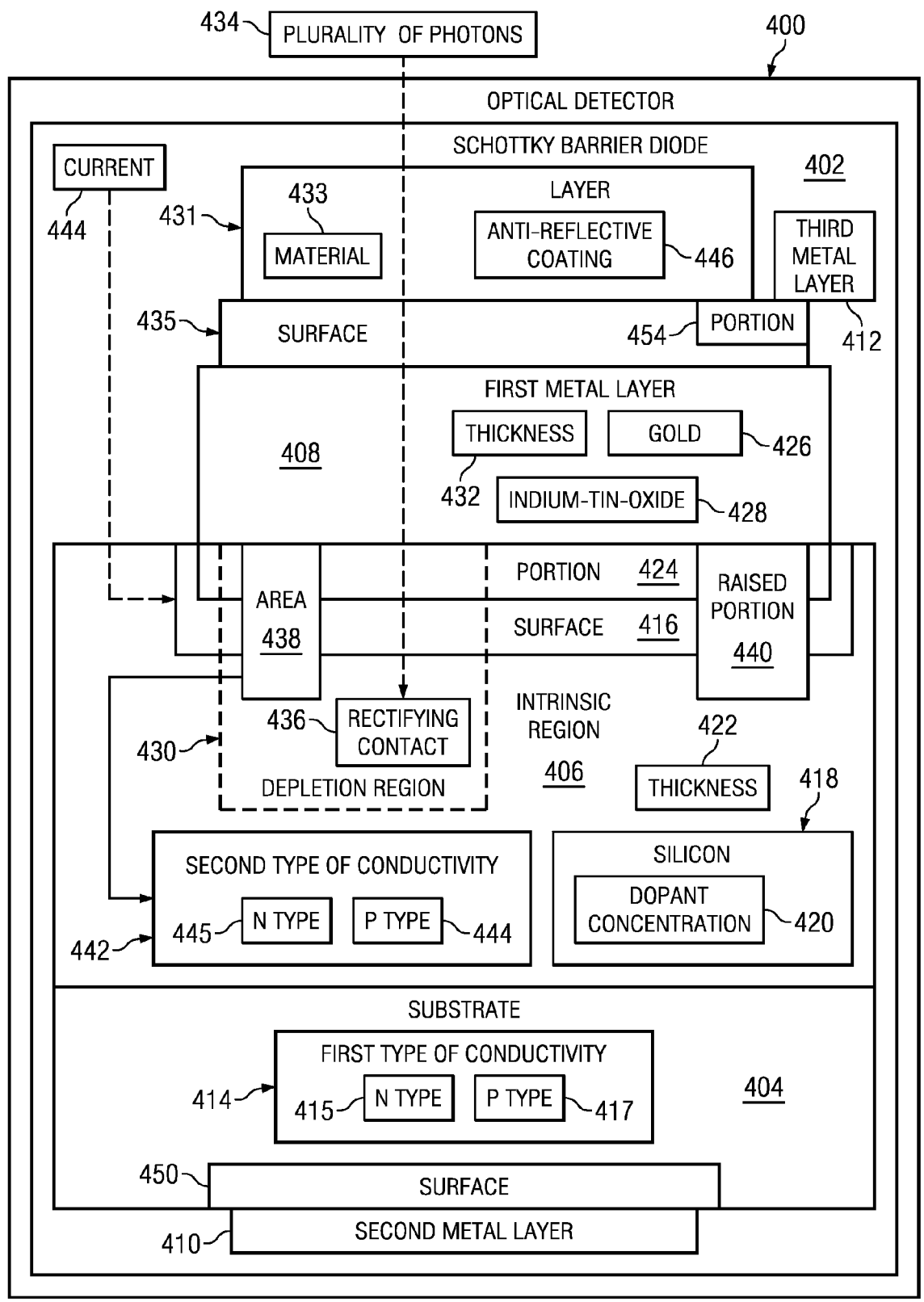
FIG. 4 is an illustration of an optical detector in which an advantageous embodiment may be implemented.

With reference now to FIG. 4, an illustration of an optical detector is depicted in which an advantageous embodiment may be implemented. In this illustrative example, optical detector 400 is an example of one implementation of optical detector 310 in FIG. 3.

Optical detector 400 takes the form of Schottky barrier diode 402 in this example. Schottky barrier diode 402 is a metal semiconductor device formed by layers of semiconductor materials and metal materials. These layers include substrate 404, intrinsic region 406, first metal layer 408, second metal layer 410, and third metal layer 412.

In this illustrative example, substrate 404 is a layer of semiconductor material upon which Schottky barrier diode 402 is formed. In other words, substrate 404 is a base layer of Schottky barrier diode 402 upon which other layers may be added. The semiconductor material selected for substrate 404 may be, for example, without limitation, silicon, germanium, gallium serenade, indium gallium arsenide, indium phosphide, and/or any other suitable semiconductor material.

As depicted, substrate 404 has first type of conductivity 414. First type of conductivity 414 may be determined by the introduction of dopants into substrate 404. In this manner, substrate 404 is doped. In these examples, a dopant is any chemical element that does not have the same atomic structure as the semiconductor material to which the dopant is added. Dopants may include, for example, without limitation, prosperous, boron, and/or other suitable substances.

The introduction of dopants into substrate 404 adds electrons or adds holes to substrate 404. These electrons and/or holes may increase the conductivity of substrate 404. When electrons are added by dopants to substrate 404, first type of conductivity 414 may be n-type 415. When holes are added by dopants to substrate 404, first type of conductivity 414 may be p-type 417. In other words, when electrons are added to substrate 404, Schottky barrier diode 402 is an n-type semiconductor device. When holes are added to substrate 404, Schottky barrier diode 402 is a p-type semiconductor device. In this manner, substrate 404 takes the form of an extrinsic semiconductor. An extrinsic semiconductor has a substantially unequal number of electrons and holes.

In these illustrative examples, intrinsic region 406 is a layer of semiconductor material that lies on top of substrate 404. Intrinsic region 406 has surface 416. In these examples, intrinsic region 406 has substantially few to no dopants within intrinsic region 406. In other words, intrinsic region 406 has a substantially equal number of electrons as compared to the number of holes. As a specific example, intrinsic region 406 consists of silicon 418 with substantially no dopants. Intrinsic region 406 may also be comprised of silicon 418. For example, silicon 418 in intrinsic region 406 may have dopant concentration 420 substantially equal to or less than about $1\times10^{15}$ dopant atoms per cubic centimeter.

Intrinsic region 406 is formed on substrate 404. Intrinsic region 406 may be formed on substrate 404 in a number different ways. For example, intrinsic region 406 may be grown, deposited, or formed on substrate 404 using any suitable process. Further, intrinsic region 406 has thickness 422. In one illustrative example, thickness 422 of intrinsic region 406 is substantially equal to or greater than about 1 micron.

First metal layer 408 is formed on portion 424 of surface 416 of intrinsic region 406. First metal layer 408 may be formed in a number of different ways. For example, first metal layer 408 may be deposited onto intrinsic region 406 using evaporation techniques, photolithographic masks, and/or other suitable techniques.

The junction of first metal layer 408 with intrinsic region 406 forms depletion region 430 extending from surface 416 into intrinsic region 406. Depletion region 430 is a region in which substantially all free electrons have been removed.

First metal layer 408 has thickness 432. Thickness 432 is selected to allow plurality of photons 434 to pass through first metal layer 408. In one illustrative example, thickness 432 of first metal layer 408 may be selected with a value from about 50 angstroms to about 100 angstroms.

In this manner, thickness 432 of first metal layer 408 allows plurality of photons 434 to enter intrinsic region 406. Optical detector 400 is a metal on semiconductor detector. Depletion region 430 in optical detector 400 extends from surface 416 of intrinsic region 406 into intrinsic region 406. Plurality of photons 434 pass through first metal layer 408 and enter directly into depletion region 430 in intrinsic region 406. In this manner, a greater percentage of photons enter depletion region 430 in intrinsic region 406 as compared to a detector without first metal layer 408, such as a semiconductor on semiconductor detector, for example a PIN diode. Further, plurality of photons 434 that enter depletion region 430 generate photoelectrons which move in intrinsic region 406 towards substrate 404.

First metal layer 408 forms rectifying contact 436 with intrinsic region 406. A rectifying contact is a contact that results in a larger current flow in the forward bias direction of the diode than a current flow in the reverse bias direction. This type of current flow is the physical phenomena of a potential barrier and also is called a Schottky barrier. This type of current flow is formed at the interface of first metal layer 408 and intrinsic region 406.

In these illustrative examples, first metal layer 408 may be comprised of gold 426, indium-tin-oxide 428, and/or other suitable metals. The chemical properties of metals such as gold 426 and indium-tin-oxide 428, allow first metal layer 408 to be deposited having thickness 432.

In these illustrative examples, first metal layer 408 has layer 431 of material 433 on surface 435 of first metal layer 408. Layer 431 is capable of receiving an optical signal traveling through an optical fiber. Layer 431 may be an example of one implementation of input surface 326 of optical detector 310 in FIG. 3. In particular, plurality of photons 434 may hit layer 431. Material 433 of layer 431 is selected to reduce the reflection of plurality of photons 434 that are received at layer 431. For example, layer 431 of material 433 may be antireflective coating 446. In these illustrative examples antireflective coating 446 may be comprised of a material selected from one of silicon nitride, silicon dioxide, and any other suitable antireflective material.

In one advantageous embodiment, raised portion 440 is formed on portion 424 of surface 416 in contact with first metal layer 408. Raised portion 440 can be formed by etching surface 416 of intrinsic region 406. Etching surface 416 to form raised portion 440 decreases the current 444. Current 444 is a source of shot noise, of the Schottky barrier diode 402.

In this illustrative example, optical detector 400 includes area 438. Area 438 extends from surface 416 into intrinsic region 406. Area 438 surrounds all of, or part of, portion 424 of surface 416 in contact with first metal layer 408 in this example. Area 438 reduces dark current 444 that flows across surface 416 of intrinsic region 406. For example, current 444 may be a dark current which is the source of shot noise in optical detector 400.

Area 438 reduces a flow of electrons across surface 416 of intrinsic region 406. As plurality of photons 434 enter intrinsic region 406, area 438 allows a greater percentage of electrons to move toward substrate 404 as compared to when area 438 is not present. This increase in the number of electrons moved is due to the reduced flow of electrons across surface 416 of intrinsic region 406.

In this illustrative example, area 438 has second type of conductivity 442. Second type of conductivity 442 is an opposite type of conductivity as compared to first type of conductivity 414 for substrate 404. In these illustrative examples, second type of conductivity 442 is p-type 444. In other illustrative examples, second type of conductivity 442 may be n-type 445.

Second type of conductivity 442 of area 438 may be formed in intrinsic region 406 in a number of different ways. For example, second type of conductivity 442 may be formed by introducing dopants into intrinsic region 406. In some advantageous embodiments, zinc may be diffused into intrinsic region 406. In other advantageous embodiments, ion implantation may be used.

In these illustrative examples, Schottky barrier diode 402 also includes second metal layer 410. Second metal layer 410 may be formed to be in contact with surface 450 of substrate 404 to form an ohmic contact. Second metal layer 410 may be formed in a number of different ways. For example, second metal layer 410 may be deposited onto surface 450 of substrate 404 using evaporation techniques, photolithographic masks, and/or other suitable types of techniques. In this illustrative example, surface 450 is substantially opposite to surface 416 of intrinsic region 406.

Additionally, third metal layer 412 may be formed to be in contact with portion 454 of surface 435 of first metal layer 408. Third metal layer 412 may also be deposited onto portion 454 of surface 435 of first metal layer 408 using evaporation techniques, sputtering, photolithographic masks, and/or other suitable types of techniques.

The illustration of optical detector 400 in FIG. 4 is not meant to imply physical or architectural limitations to the manner in which different advantageous embodiments may be implemented. Other components in addition to, and/or in place of, the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in some advantageous embodiments, intrinsic region 406 may be comprised of a semiconductor material other than silicon. The semiconductor material may be, for example, without limitation, germanium. In other advantageous embodiments, first metal layer 408 may be comprised of metals in addition to, or in place of, gold 426 and/or indium-tin-oxide 428, such as, for example, without limitation, silver, platinum, copper, and/or nickel.

Figure 5:
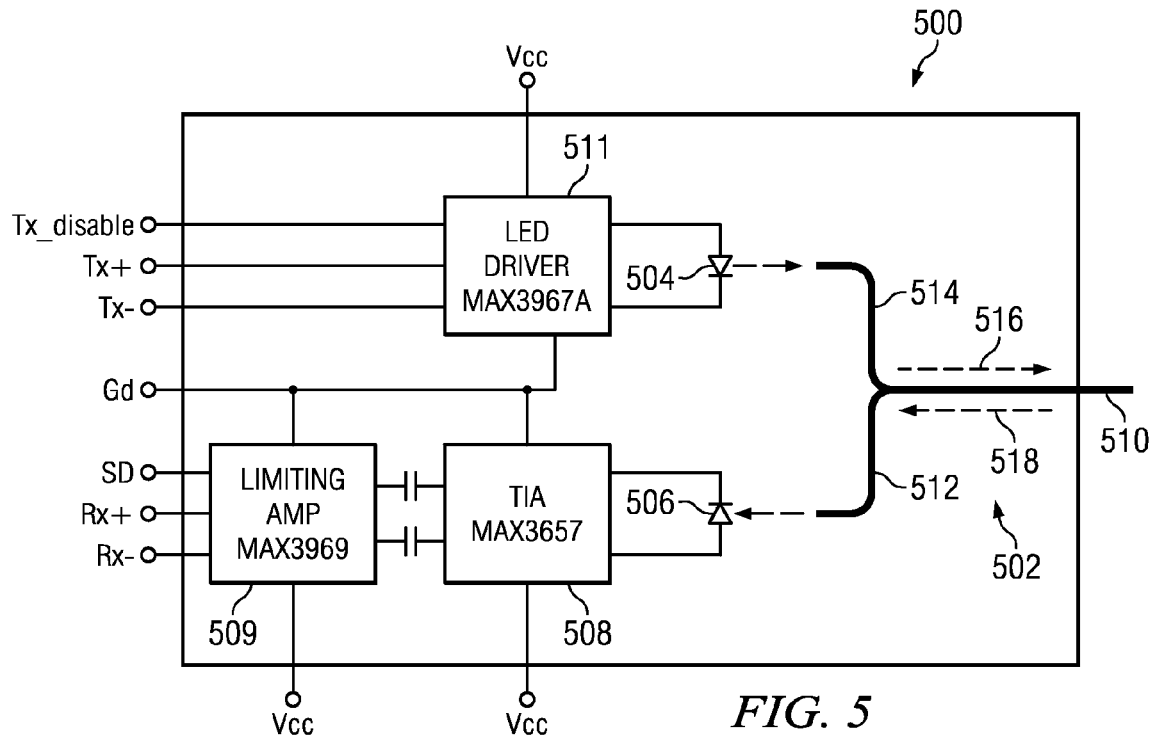
FIG. 5 is an illustration of a transceiver in which an advantageous embodiment may be implemented.

With reference now to FIG. 5, an illustration of a transceiver is depicted in which an advantageous embodiment may be implemented. In these illustrative examples, transceiver 500 is an example of one implementation for transceiver 304 in FIG. 3. As depicted, transceiver 500 includes optical splitter 502, light emitting diode 504, optical detector 506, transimpedance amplifier 508, limiting amplifier 509, and driving amplifier 511.

In this illustrative example, optical splitter 502 is an example of one implementation of optical splitter 358 in FIG. 3. As depicted, optical splitter 502 is a plastic optical fiber splitter with first port 510, second port 512, and third port 514. Optical splitter 502 sends and/or receives optical signals traveling through plastic optical fibers in this illustrative example.

For example, optical splitter 502 may receive signal 516 at third port 514 and may send signal 516 through first port 510. Signal 516 is sent to third port 514 by light emitting diode 504. In these examples, light emitting diode 504 may be red, blue, or green light emitting diode. Optical splitter receives signal 518 at first port 510 and may send signal 518 to optical detector 506 through second port 512. In other advantageous embodiments, optical signals are sent and/or received using a medium other than plastic optical fibers, such as glass optical fibers.

In this depicted example, optical detector 506 may be an example of one implementation of optical detector 310 in FIG. 3 and/or optical detector 400 in FIG. 4. Optical detector 506 may take the form of, for example, a Schottky barrier diode, a PIN diode, or some other suitable type of optical detector.

As depicted, optical detector 506 is connected to transimpedance amplifier 508. In these illustrative examples, transimpedance amplifier 508 may be implemented using MAX3657 transimpedance amplifier provided by Maxim® Integrated Products, Inc. Further, transimpedance amplifier 508 is connected to limiting amplifier 509. In this depicted example, limiting amplifier 509 may be implemented using MAX3969 limiting amplifier provided by Maxim® Integrated Products, Inc.

Further, light emitting diode 504 is connected to driver amplifier 511. In these illustrative examples, driver amplifier 511 may be implemented using Maxim® MAX3967 A amplifier provided by Maxim® Integrated Products, Inc.

Figure 6:
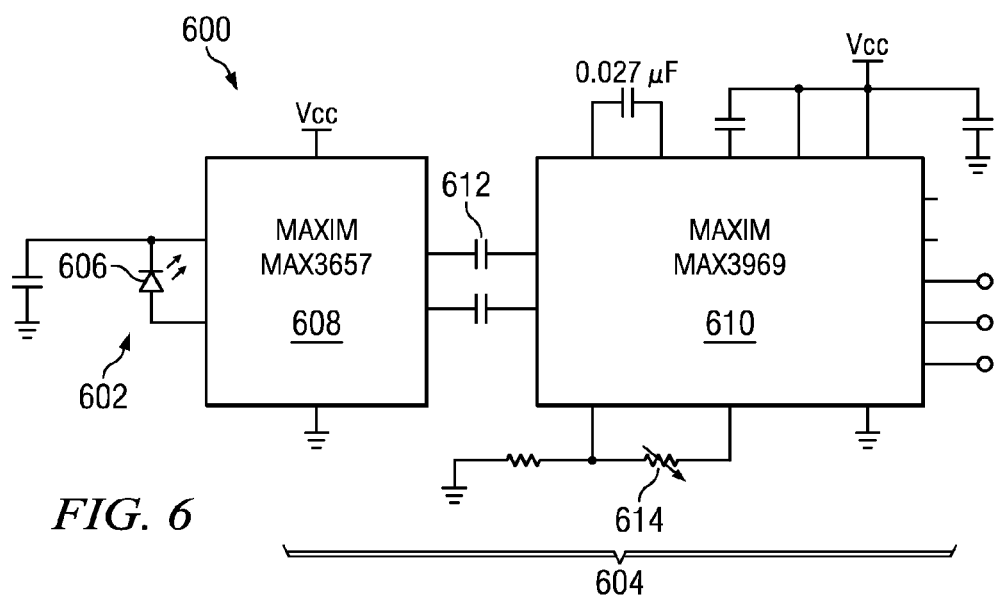
FIG. 6 is an illustration of an optical receiver in which an advantageous embodiment may be implemented.

With reference now to FIG. 6, an illustration of an optical receiver is depicted in which an advantageous embodiment may be implemented. In these illustrative examples, optical receiver 600 is an example of one implementation of optical receiver 306 in FIG. 3. As depicted, optical detector 602 is connected to two stage amplifier system 604. Optical detector 602 is an example of one implementation of optical detector 310 in FIG. 3 and/or optical detector 400 in FIG. 4. Two stage amplifier is an example of one implementation of two stage amplifier system 311 in FIG. 3.

Optical detector 602 receives optical signal 606. In a network with plastic optical fibers, optical signal 606 will have a wavelength in the visible spectrum. For example, optical signal 606 may have a wavelength of about 650 nanometers. This wavelength corresponds to a red wavelength in the visible spectrum. In some illustrative examples, optical signal 606 may have a wavelength of about 500 nanometers, which is a green wavelength. In other illustrative examples, optical signal 606 may have a wavelength of about 450 nanometers, which is a blue wavelength.

For a signal with a wavelength of about 650 nanometers, optical detector 602 may be implemented using a S5971 silicon PIN detector provided by Hamamatsu® Corporation. Alternatively, for a signal with a wavelength of about 500 nanometers, optical detector 602 may be implemented using a S5973 silicon PIN detector provided by Hamamatsu® Corporation.

In this illustrative example, two stage amplifier system 604 includes transimpedance amplifier 608 connected to limiting amplifier 610. Alternating current coupling capacitors 612 are used to connect transimpedance amplifier 608 to limiting amplifier 610. Alternating current coupling capacitors 612 may be selected to have a capacitance of about 0.01 microfarads.

As depicted, variable resistor 614 is connected to transimpedance amplifier 608. Variable resistor 614 allows two stage amplifier system 604 to be tuned for a desired Signal Detect (SD) sensitivity. For plastic optical fiber networks, the desired signal detect sensitivity level of optical receiver 600 may be a sensitivity having a value substantially equal to or less than about −32 decibel milliwatts.

Figure 7:
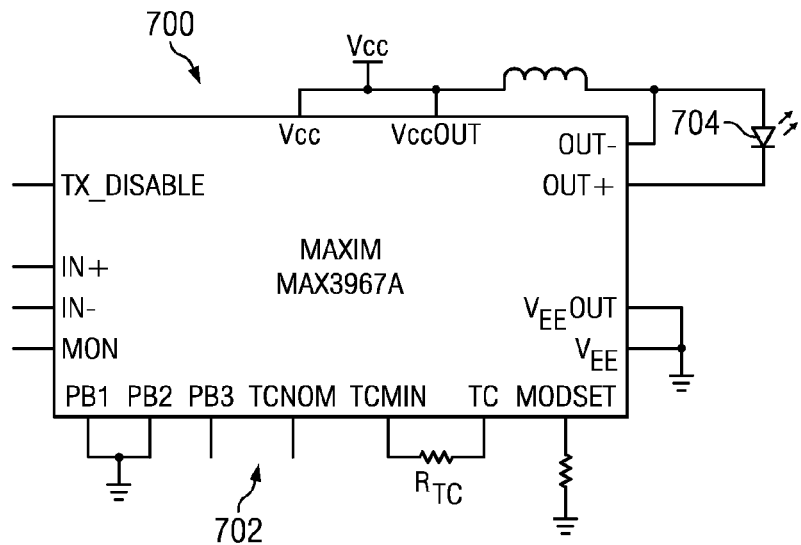
FIG. 7 is an illustration of an optical transmitter in which an advantageous embodiment may be implemented.

With reference now to FIG. 7, an illustration of an optical transmitter is depicted in which an advantageous embodiment may be implemented. In this illustrative example, optical transmitter 700 is an example of one implementation of optical transmitter 314 in FIG. 3. As depicted, optical transmitter 700 includes driver amplifier 702 and light emitting diode 704.

In this illustrative example, driver amplifier 702 sends a bias current and a modulation current to drive light emitting diode 704. The amount of bias current and modulation current sent is selected to allow light emitting diode 704 to generate at least about one milliwatt of average optical power. The optical power generated is coupled into an optical fiber, such as second optical fiber 322 in FIG. 3. Since light signal from the light emitting diodes are light pulses, the average power is the power of these output light pulses averaged over time.

In these depicted examples, when light emitting diode 704 is a red light emitting diode, light is emitted with a wavelength of about 650 nanometers. Alternatively, when light emitting diode 704 is a green light emitting diode, light is emitted with a wavelength of about 500 nanometers. Further, when light emitting diode 704 is a blue light emitting diode, light is emitted with wavelength of about 450 nanometers. In these examples, light emitting diode 704 may be a L10762 or L8628 light emitting diode from Hamamatsu® Corporation or a Z16003 light emitting diode from Zarlink® Semiconductor, Incorporated.

Figure 8:
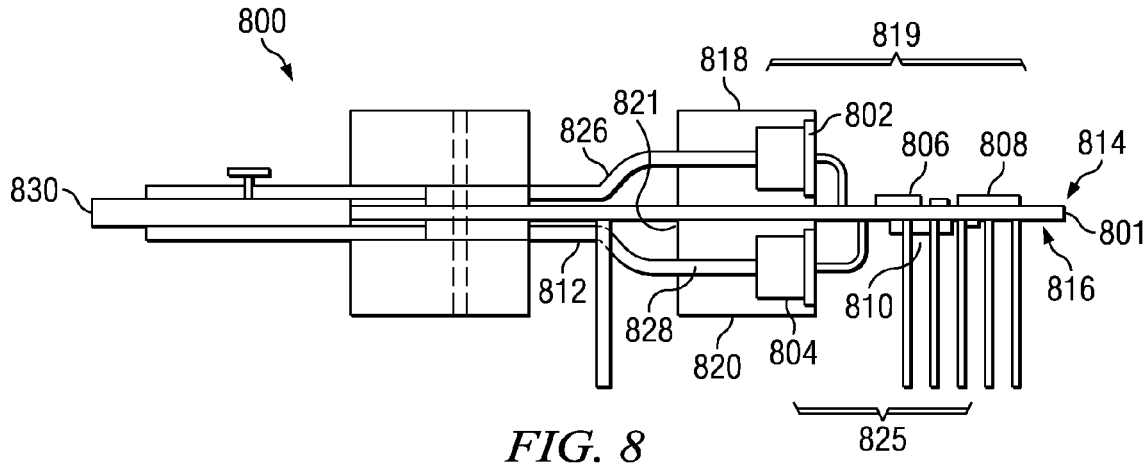
FIG. 8 is an illustration of a transceiver in which an advantageous embodiment may be implemented.

With reference now to FIG. 8, an illustration of a transceiver is depicted in which an advantageous embodiment may be implemented. In this illustrative example, transceiver 800 is an example of one implementation of transceiver 304 in optical signal environment 300 in FIG. 3. As depicted, transceiver 800 is seen from a side view. Transceiver 800 includes printed wiring board 801, optical detector 802, light emitting diode 804, transimpedance amplifier 806, limiting amplifier 808, driver amplifier 810, and plastic optical fiber splitter 812.

In this illustrative example, printed wiring board 801 is an example of one implementation of substantially planar insulating structure 370 in FIG. 3. Printed wiring board 801 has first surface 814 and second surface 816. As depicted, optical detector 802 is located in housing 818. Housing 818 is located on first surface 814 of printed wiring board 801. Further, housing 818 may be connected to first surface 814 using, for example, a thermally conductive epoxy. In this manner, optical detector 802 is connected to first surface 814 of printed wiring board 801. Housing 818 may take the form of a hermetically sealed TO 18 can with a glass window cap or a lensed cap in this illustrative example.

As depicted, transimpedance amplifier 806 and limiting amplifier 808 are also connected to first surface 814 of printed wiring board 801. In these examples, transimpedance amplifier 806 and limiting amplifier 808 are located outside of housing 818. Transimpedance amplifier 806, limiting amplifier 808, and optical detector 802 comprise optical receiver 819.

Light emitting diode 804 is connected to driver amplifier 810 to form transmitter 825. As depicted, both light emitting diode 804 and driver amplifier 810 are located on second surface 816 of printed wire board 801. Light emitting diode 804 is located in housing 820. Housing 820 and driver amplifier 810 are connected to second surface 816 of printed wiring board 801. Housing 820 may be connected to second surface 816 using a thermally conductive epoxy. Housing 820 may take the form of a hermetically sealed TO 18 can with a glass window cap or a lensed cap in this illustrative example.

Further, in this depicted example, housing 820 is connected to printed wiring board 801 using structure 821. Structure 821 may take the form of a metal holder in this illustrative example. The connection of housing 820 to printed wiring board 801 through structure 821 forms a heat sink. This heat sink allows heat generated by light emitting diode 804 in housing 820 to be reduced. In other words, this heat sink conducts the heat generated by light emitting diode 804 away from light emitting diode 804 and towards printed wiring board 801. This conduction of heat away from light emitting diode 804 prevents light emitting diode 804 from overheating.

In this illustrative example, plastic optical fiber splitter 812 has first arm 826 and second arm 828. First arm 826 is connected to housing 818 on first surface 814. Second arm 828 is connected to housing 820 on second surface 816. This configuration of first arm 826 and second arm 828 saves surface space on printed wiring board 801. In these examples, these savings in surface space may be about 50 percent as compared to transceivers having receivers and transmitters on the same surface of the printed wiring board. This configuration also reduces the bending of first arm 826 and second arm 828 of plastic optical fiber splitter 812. Further, this configuration improves the reliability and optical coupling efficiency of plastic optical fiber splitter 812. For example, the configuration may reduce the bending of the arms of plastic optical fiber splitter 812.

For example, transceiver 800 may be formed with dimensions that allow savings in surface space. These dimensions for transceiver 800 may be, for example, without limitation, about 0.3 inches in width, about 1.9 inches in length, and about 0.5 inches in height.

First arm 826 of plastic optical fiber splitter 812 couples an input of transceiver 800 to optical detector 802. This input may be an output of plastic optical fiber 830. For example, plastic optical fiber splitter 812 may receive an optical signal traveling through plastic optical fiber 830.

Second arm 828 of plastic optical fiber splitter 812 couples transmitter 825 to an output of transceiver 800. Further, second arm 828 couples signal power generated by light emitting diode 804 to an output of transceiver 800. In these illustrative examples, both first arm 826 and second arm 828 have a diameter of about one millimeter. This diameter is substantially the same as the diameter of an input surface of optical detector 802.

Figure 9:
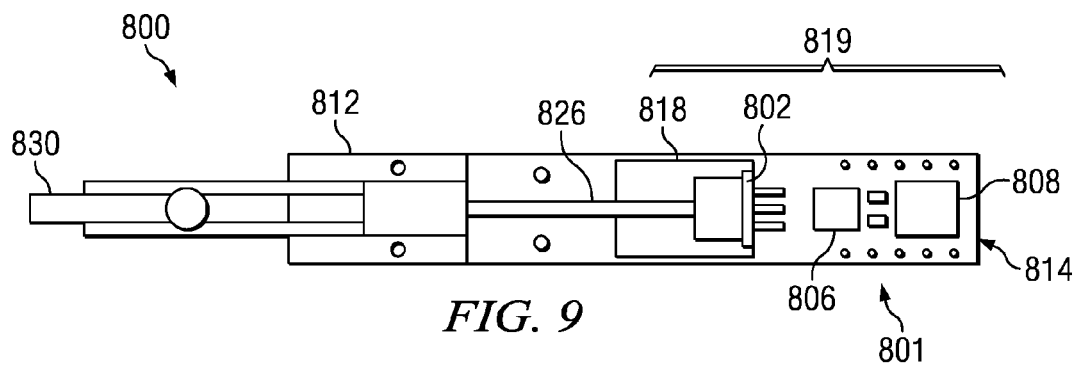
FIG. 9 is an illustration of a top view of a transceiver in accordance with an advantageous embodiment.

With reference now to FIG. 9, an illustration of a top view of a transceiver is depicted in accordance with an advantageous embodiment. In this illustrative example, transceiver 800 is seen from first surface 814.

Figure 10:
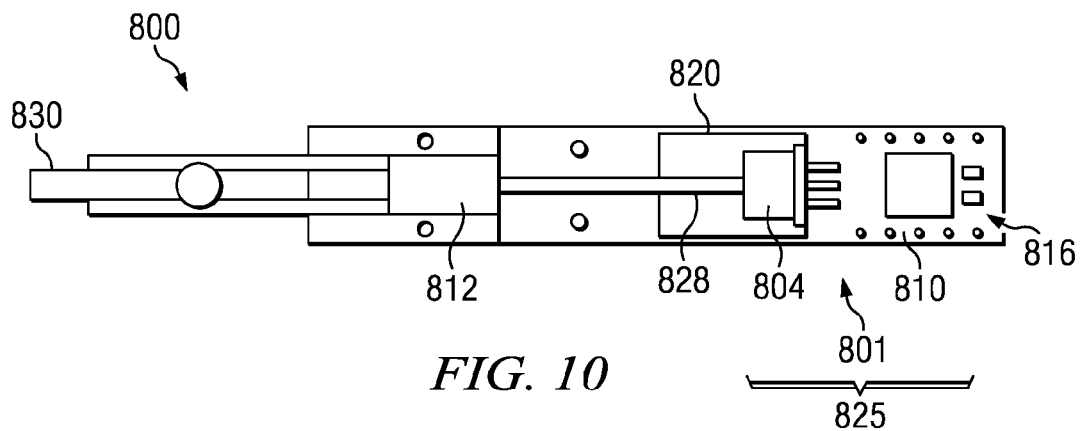
FIG. 10 is an illustration of a bottom view of a transceiver in accordance with an advantageous embodiment.

With reference now to FIG. 10, an illustration of a bottom view of a transceiver is depicted in accordance with an advantageous embodiment. In this illustrative example, transceiver 800 is seen from second surface 816.

Figure 11:
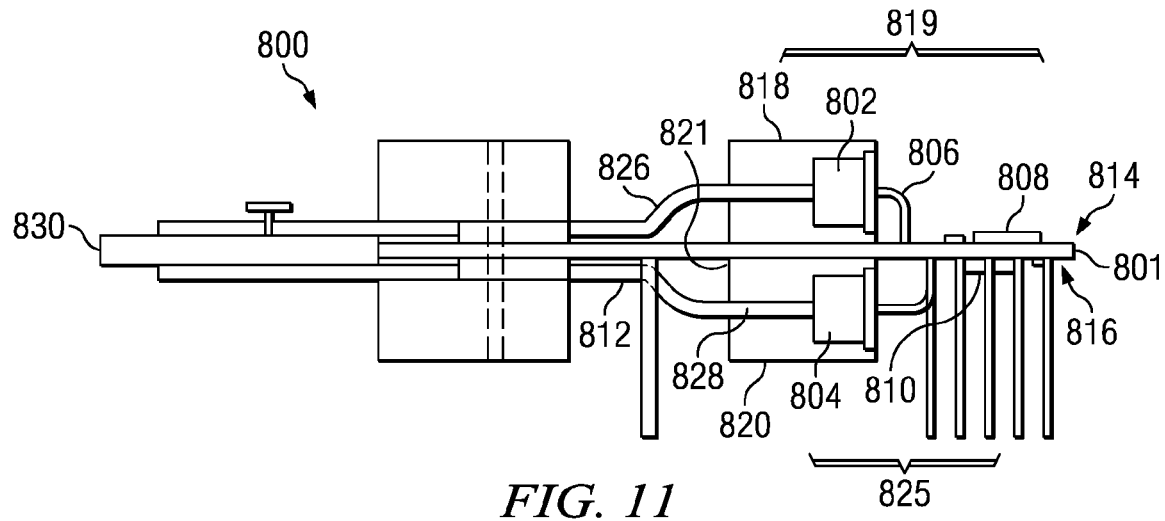
FIG. 11 is an illustration of a transceiver in accordance with an advantageous embodiment.

With reference now to FIG. 11, an illustration of a transceiver is depicted in accordance with an advantageous embodiment. In this illustrative example, transceiver 800 has both optical detector 802 and transimpedance amplifier 806 located within housing 818.

This configuration reduces a distance of the connection of optical detector 802 to transimpedance amplifier 806. This reduced distance, in turn, increases a sensitivity of optical receiver 819. Further, the reduced distance of the connection between optical detector 802 and transimpedance amplifier 806 reduces interference that may occur through the distance of the connection.

Still further, having both optical detector 802 and transimpedance amplifier 806 located in housing 818 allows surface space savings for transceiver 800. For example, the configuration of transceiver 800 in FIG. 11 may have dimensions that are smaller than the configuration of transceiver 800 in FIGS. 8, 9, and 10. In FIG. 11, transceiver 800 may have dimensions of about 0.3 inches in width, about 1.7 inches in length, and about 0.5 inches in height.

Figure 12:
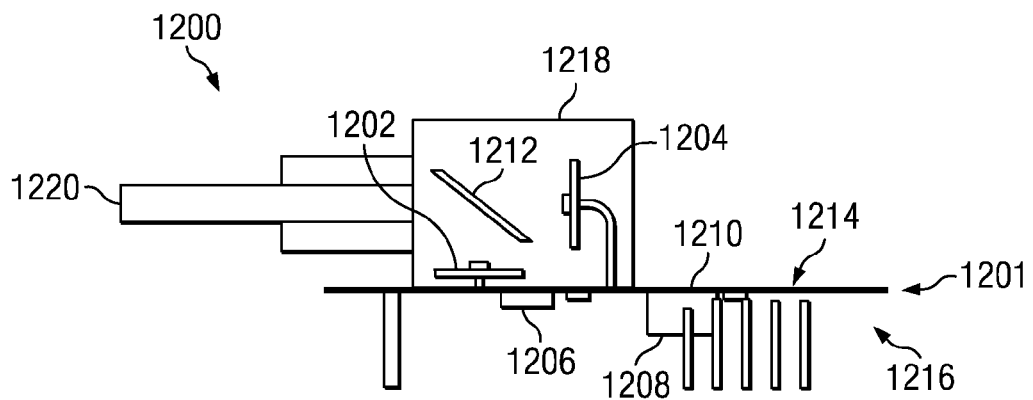
FIG. 12 is an illustration of a transceiver in which an advantageous embodiment may be implemented.

With reference now to FIG. 12, an illustration of a transceiver is depicted in which an advantageous embodiment may be implemented. In this illustrative example, transceiver 1200 is an example of one implementation of transceiver 304 in optical signal environment 300 in FIG. 3. As depicted, transceiver 1200 is seen from a side view. Transceiver 1200 includes printed wiring board 1201, optical detector 1202, light emitting diode 1204, transimpedance amplifier 1206, limiting amplifier 1208, driver amplifier 1210, and filter 1212.

In this illustrative example, printed wiring board 1201 is an example of one implementation of substantially planar insulating structure 370 in FIG. 3. Printed wiring board 1201 has first surface 1214 and second surface 1216. As depicted, optical detector 1202 is located in housing 1218. Housing 1218 is located on first surface 1214 of printed wiring board 1201. Further, housing 1218 may be connected to first surface 1214 using, for example, a thermally conductive epoxy. In this manner, optical detector 1202 is connected to first surface 1214 of printed wiring board 1201.

As depicted, transimpedance amplifier 1206 and limiting amplifier 1208 are connected to optical detector 1202. In this illustrative example, transimpedance amplifier 1206 and limiting amplifier 1208 are connected to second surface 1216 of printed wiring board 1201.

Light emitting diode 1204 is connected to driver amplifier 1210. As depicted, both light emitting diode 804 and driver amplifier 810 are located on first surface 1214 of printed wire board 801. Light emitting diode 1204 is also located in housing 1218.

In this advantageous embodiment, filter 1212 is used in place of a splitter, such as plastic optical fiber splitter 812 in FIG. 8. Filter 1212 is an example of one implementation of filter 361 in FIG. 3. Filter 1212 transmits one wavelength and reflects another wavelength. For example, filter 1212 can be configured to transmit green wavelengths and reflect red wavelengths. Alternatively, filter 1212 can be configured to transmit red wavelength and reflect green wavelength.

In these illustrative examples, filter 1212 is configured to reflect a signal received on plastic optical fiber 1220 having a range of wavelengths to optical detector 1202. Filter 1212 is further configured to allow a signal having a range of wavelengths from light emitting diode 1204 to be received on plastic optical fiber 1220.

Having both optical detector 1202 and light emitting diode 1204 located in housing 1218 allows surface space savings for transceiver 1200. For example, the configuration of transceiver 1200 may have dimensions that are smaller than the configuration of transceiver 800 in FIGS. 8-11. In FIG. 12, transceiver 1200 may have dimensions of about 0.53 inches in width, about 1.4 inches in length, and about 0.45 inches in height.

Figure 13:
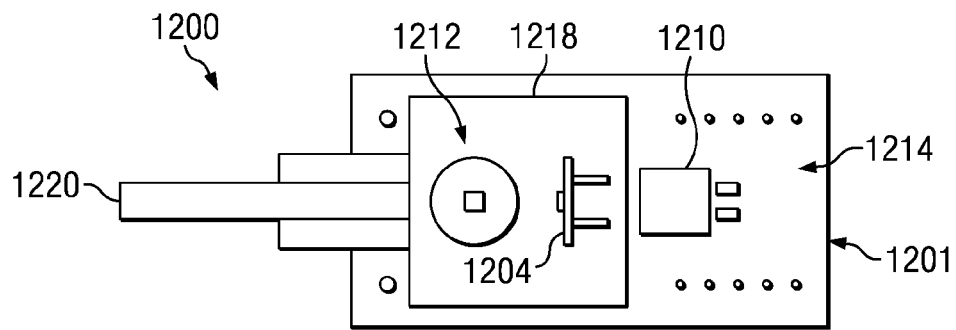
FIG. 13 is an illustration of a top view of a transceiver in accordance with an advantageous embodiment.

With reference now to FIG. 13, an illustration of a top view of a transceiver is depicted in accordance with an advantageous embodiment. In this illustrative example, transceiver 1200 is seen from first surface 1214.

Figure 14:
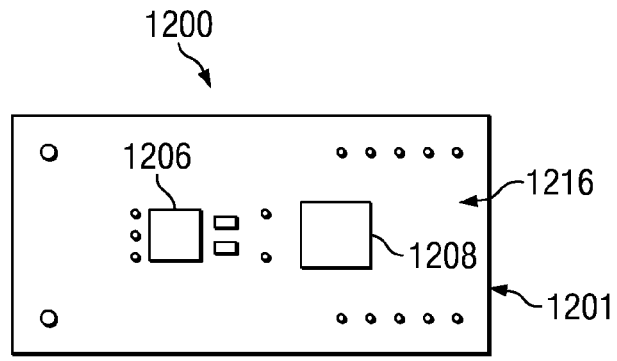
FIG. 14 is an illustration of a bottom view of a transceiver in accordance with an advantageous embodiment.

With reference now to FIG. 14, an illustration of a bottom view of a transceiver is depicted in accordance with an advantageous embodiment. In this illustrative example, transceiver 1200 is seen from second surface 1216.

The processes, steps, and structures described below in FIGS. 15-21 do not form a complete process flow for manufacturing integrated circuits. The present invention can be practiced in conjunction with integrated circuit fabrication techniques currently used in the art, and only so much of the commonly practiced process steps are included as necessary for an understanding of the present disclosure. The figures represent cross sections of a portion of an integrated circuit during fabrication and are not drawn to scale, but instead are drawn so as to illustrate features in the one or more of the different advantageous embodiments.

Figure 15:
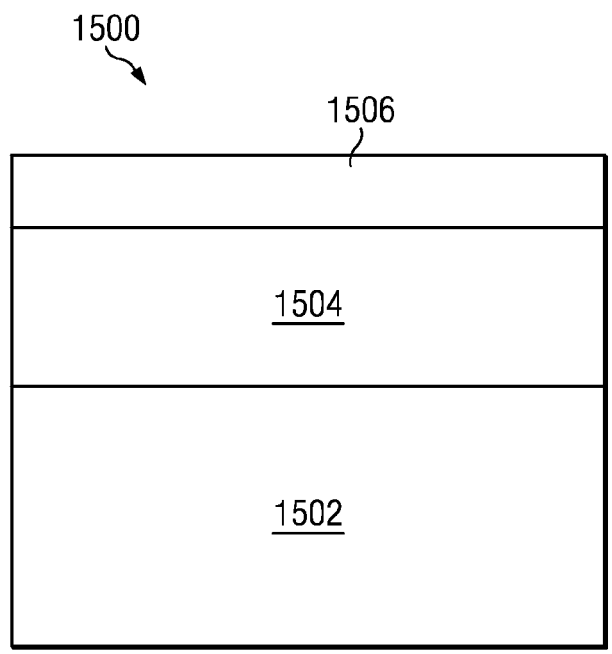
FIG. 15 is an illustration of a cross-sectional view of a portion of an integrated circuit during fabrication in which an advantageous embodiment may be implemented.

With reference now to FIG. 15, an illustration of a cross-sectional view of a portion of an integrated circuit during fabrication is depicted in which an advantageous embodiment may be implemented. Integrated circuit 1500 may be an example of one implementation of optical detector 400 in FIG. 4 during a fabrication process. In this example, integrated circuit 1500 includes substrate 1502, intrinsic region 1504 and insulation layer 1506.

In these illustrative examples, substrate 1502 is a semiconductor material having a type of conductivity. Substrate 1502 may be an n-type substrate or a p-type substrate. In this example, substrate 1502 may be used as a material upon which to form an optical detector, such as optical detector 400 in FIG. 4.

Intrinsic region 1504 is formed on substrate 1502. In this example, intrinsic region 1504 is formed with a thickness of about 1 micron or greater. Intrinsic region 1504 may be deposited or grown onto substrate 1502 using epitaxial growth processes. Epitaxial growth is a process in which a layer or film of a semiconductor material is deposited on the surface of a substrate. The epitaxial growth process may be used to control the dopant concentration, thickness, and composition of the layer or film deposited.

For example, intrinsic region 1504 may take the form of a single crystal silicon semiconductor layer. The silicon in intrinsic region 1504 may have a dopant concentration substantially equal to or less than about $1 \times 10^{15}$ dopant atoms per cubic centimeter.

Insulation layer 1506 is formed on intrinsic region 1504. Insulation layer 1506 can be formed by a process such as oxidation. Oxidation is a process of heating a silicon layer to a temperature of about 1000 to about 1200 degrees Celsius in the presence of oxygen. Oxidation results in a layer of silicon dioxide insulating material being formed on the surface of the silicon layer.

Figure 16:
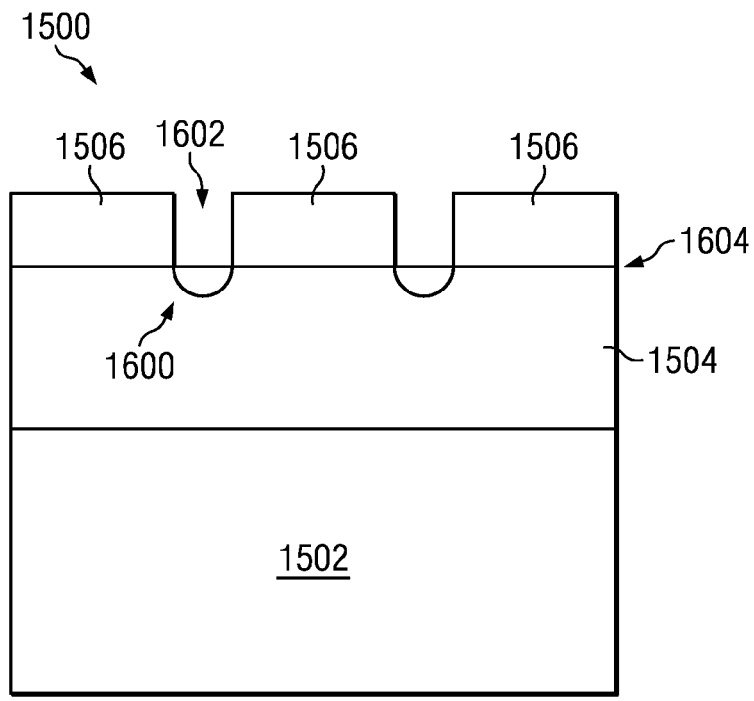
FIG. 16 is an illustration of a cross-sectional view of a portion of an integrated circuit during fabrication in which an advantageous embodiment may be implemented.

With reference now to FIG. 16, an illustration of a cross-sectional view of a portion of an integrated circuit during fabrication is depicted in which an advantageous embodiment may be implemented. Integrated circuit 1500 has area 1600 added to the configuration of integrated circuit 1500 in FIG. 15. Area 1600 is formed in intrinsic region 1504.

In these illustrative examples, area 1600 may be formed into a ring shape surrounding a portion of surface 1604 of intrinsic region 1504. In other advantageous embodiments, area 1600 may be formed to only partially surround a portion of surface 1604. In still other advantageous embodiments, area 1600 may be formed into any number of shapes such as, for example, without limitation, a square shape, a rectangle shape, an oval shape, a donut shape, a horseshoe shape, or some other suitable shape.

Area 1600 is comprised of a semiconductor material and has a type of conductivity opposite of intrinsic region 1504. For example, area 1600 is a p-type semiconductor material. Area 1600 may also be an n-type semiconductor material. Area 1600 is an example of one implementation of area 438 in FIG. 4.

Area 1600 can be formed in intrinsic region 1504 by removing portions 1602 from insulation layer 1506. Portions 1602 may be removed using photolithographic masks to define portions 1602 to be etched away. Etching is a process of removing portions of a semiconductor or dielectric material using chemicals to remove the material with the aid of photoresist masking steps. Then, area 1600 may be formed by diffusing dopants into surface 1604 of intrinsic region 1504. For example, area 1600 can be formed by diffusing zinc into an area of intrinsic region 1504. Diffusion is the adding of dopants by heating a surface of a semiconductor material in the presence of the dopant. Area 1600 can also be formed using ion implantation processes. Ion implementation is the process of bombarding a semiconductor with atoms from a particle accelerator.

Figure 17:
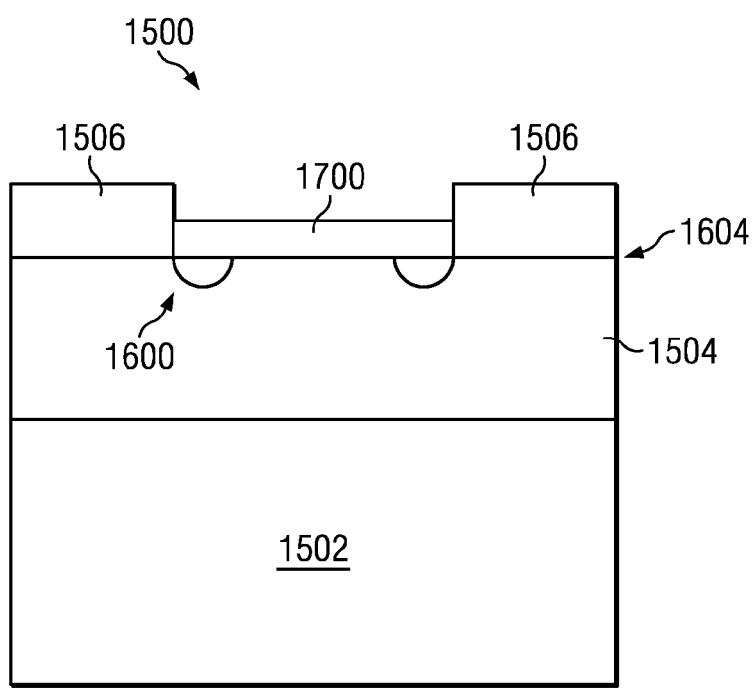
FIG. 17 is an illustration of a cross-sectional view of a portion of an integrated circuit during fabrication in which an advantageous embodiment may be implemented.

With reference now to FIG. 17, an illustration of a cross-sectional view of a portion of an integrated circuit during fabrication is depicted in which an advantageous embodiment may be implemented. Integrated circuit 1500 has metal layer 1700 added to the configuration of integrated circuit 1500 in FIG. 16. As depicted, metal layer 1700 is formed on intrinsic region 1504.

Metal layer 1700 is formed on a portion of the surface of intrinsic layer 1504. Metal layer 1700 is an example of one implementation of first metal layer 408 in FIG. 4.

Metal layer 1700 can be formed on intrinsic region 1504 by removing portions from insulation layer 1506. Portions of insulation layer 1506 may be removed using photolithographic masks to define a portion of surface 1604 of intrinsic region 1504 for metal layer 1700 to be deposited upon. Metal layer 1700 can then be deposited onto the surface of the intrinsic layer through evaporation. Evaporation is the process of heating a metal to its boiling point in a vacuum. Using evaporation, metal layer 1700 can be deposited to thickness of about 50 angstroms to about 100 angstroms.

Figure 18:
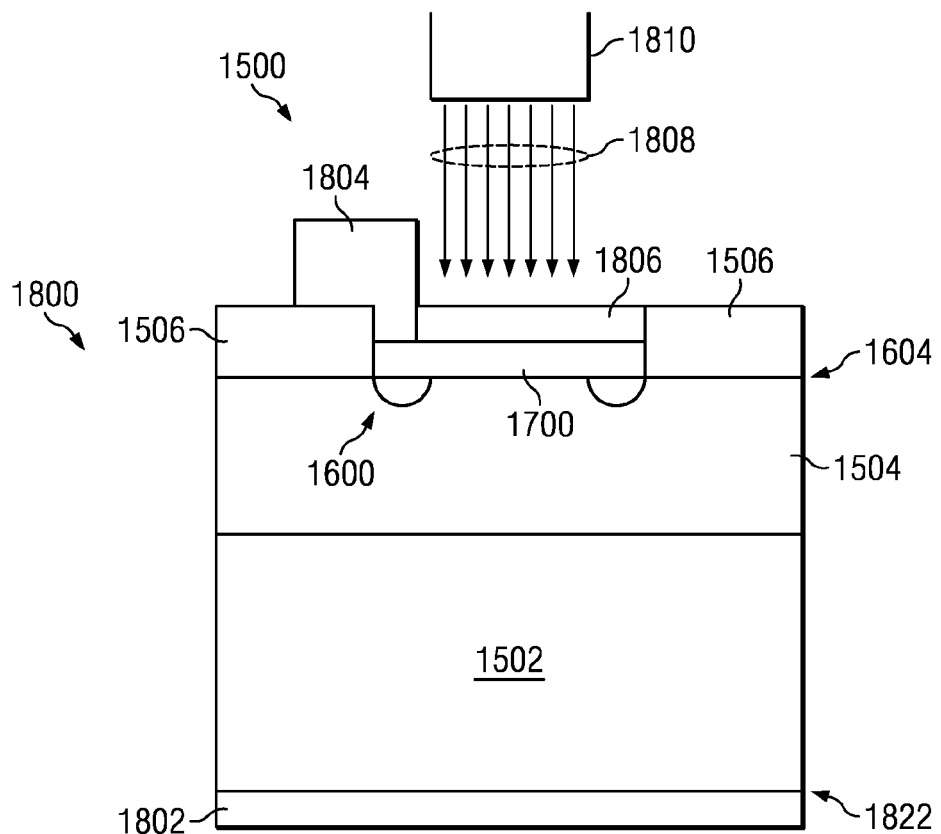
FIG. 18 is an illustration of a cross-sectional view of a portion of an integrated circuit during fabrication in which an advantageous embodiment may be implemented.

With reference now to FIG. 18, an illustration of a cross-sectional view of a portion of an integrated circuit is depicted in which an advantageous embodiment may be implemented. In this illustrative example, integrated circuit 1500 takes the form of optical detector 1800.

In this illustrative example, optical detector 1800 has first metal contact 1802, second metal contact 1804, and layer of material 1806 added to the configuration of integrated circuit 1500 in FIG. 17.

First metal contact 1802 is formed on surface 1822 of substrate 1502. First metal contact 1802 may be deposited on substrate 1502 through evaporation, as discussed above.

Layer of material 1806 is formed on a portion of metal layer 1700. For example, layer of material 1806 may be an antireflective coating. In this illustrative example, layer of material 1806 may be coupled to an optical fiber to receive an optical signal, such as first optical signal 324 in FIG. 3. For example, an antireflective coating may be formed by depositing materials by sputtering or plasma deposition processes.

Second metal contact 1804 is formed above insulation layer 1506 and contacts a portion of metal layer 1700. Second metal contact 1804 may be deposited through evaporation and/or plating techniques. Additionally photolithographic masks and/or etching may be used to define areas for second metal contact 1804 to be deposited. For example, second metal contact 1804 is deposited on insulation layer 1506 and contacts a portion of metal layer 1700.

Area 1600 extends from surface 1604 of intrinsic region 1504 into intrinsic region 1504. Area 1600 also surrounds the portion of surface 1604 in contact with metal layer 1700.

Plurality of photons 1808 travel through plastic optical fiber 1810 and are received by optical detector 1800. Layer of material 1806 reduces a reflection of plurality of photons 1808 from metal layer 1700. Plurality of photons 1808 pass through metal layer 1700 and enter into intrinsic region 1504. The absorption of plurality of photons 1808 into intrinsic region 1504 pushes electrons in intrinsic region 1504 downwards into substrate 1502 generating an electrical signal.

Area 1600 surrounds the area of intrinsic region 1504 where the majority of plurality of photons 1808 enter intrinsic region 1504. Area 1600 reduces flow of electrons along surface 1604. Electrons moving along surface 1604 may be referred to as excess dark current which is a source of shot noise in optical detector 1800. Instead of flowing along surface 1604, area 1600 increases a flow of electrons toward substrate 1502 to generate an electrical signal. As a result, an electrical signal is generated with greater sensitivity to an input of plurality of photons 1808.

Figure 19:
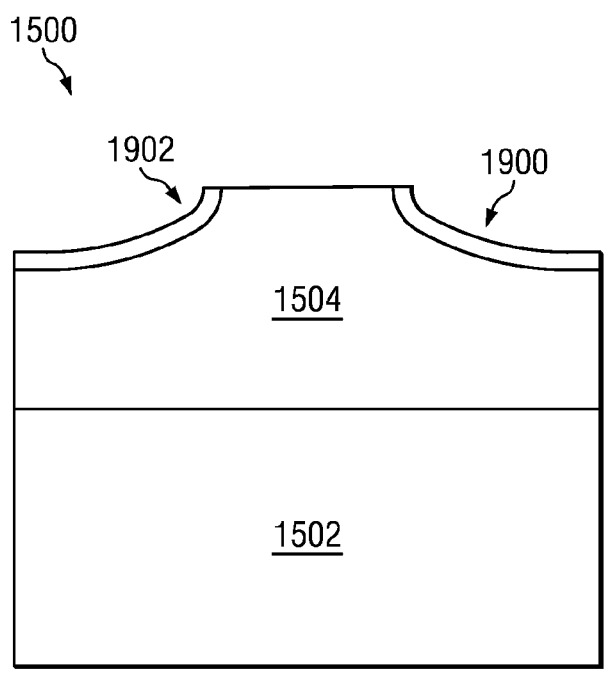
FIG. 19 is an illustration of a cross-sectional view of a portion of an integrated circuit during fabrication in which an advantageous embodiment may be implemented.

With reference now to FIG. 19, an illustration of a cross-sectional view of a portion of an integrated circuit during fabrication is depicted in which an advantageous embodiment may be implemented. In this illustrative example, integrated circuit 1500 has layer 1900 added to the configuration of integrated circuit 1500 in FIG. 15.

As depicted, layer 1900 is formed on intrinsic region 1504. Layer 1900 can be formed by the process of etching away portions of the surface of intrinsic region 1504 and then depositing an insulation layer on the remaining or etch surface of intrinsic region 1504. Layer 1900 may be a passivation layer. A passivation layer is used to prevent the etched surface from being unprotected with atoms exposed. Layer 1900 protects the etched surface by bonding with the exposed atoms of surface of intrinsic region 1504, once the surface of intrinsic region 1504 has been etched. Etching is a process of removing portions of a surface of a semiconductor material using chemicals removal with the aid of photoresist masking steps. For example, layer 1900 may be a layer of silicon dioxide to passivate the etched silicon surface of intrinsic region 1504. The etching to form layer 1900 forms raised portion 1902 of the surface of intrinsic region 1504. Raised portion 1902 is an example of one implementation of raised portion 440 in FIG. 4.

Figure 20:
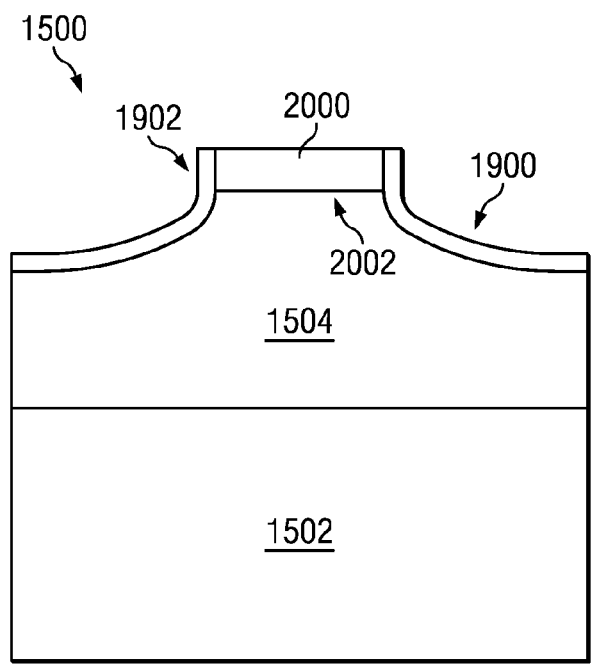
FIG. 20 is an illustration of a cross-sectional view of a portion of an integrated circuit during fabrication in which an advantageous embodiment may be implemented.

With reference now to FIG. 20, an illustration of a cross-sectional view of a portion of an integrated circuit during fabrication is depicted in which an advantageous embodiment may be implemented. In this illustrative example, integrated circuit 1500 has metal layer 2000 added to the configuration of integrated circuit 1500 in FIG. 15. Metal layer 2000 is formed on intrinsic region 1504.

Metal layer 2000 is formed on a portion of the surface of intrinsic layer 1504. Metal layer 2000 is an example of one implementation of first metal layer 408 in FIG. 4.

Metal layer 2000 can be formed on intrinsic region 1504 by removing portions from layer 1900. Portions of layer 1900 may be removed using photolithographic masks to define a portion of surface 2002 of intrinsic region 1504 for metal layer 2000 to be deposited upon. Metal layer 2000 may then be deposited onto intrinsic layer 1504 through evaporation techniques, as discussed above. Using evaporation techniques, metal layer 2000 can be deposited to thickness of about 50 angstroms to about 100 angstroms.

Figure 21:
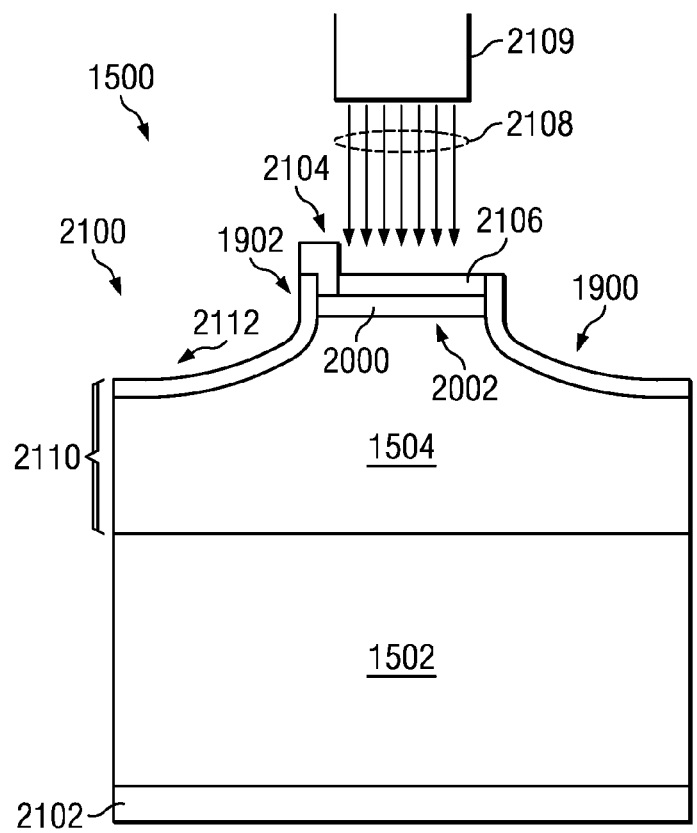
FIG. 21 is an illustration of a cross-sectional view of a portion of an integrated circuit during fabrication in which an advantageous embodiment may be implemented.

With reference now to FIG. 21, an illustration of a cross-sectional view of a portion of an integrated circuit is depicted in which an advantageous embodiment may be implemented. In this illustrative example, integrated circuit 1500 takes the form of optical detector 2100. As depicted, optical detector 2100 has first metal contact 2102, second metal contact 2104 and layer of material 2106 added to the configuration of integrated circuit 1500 in FIG. 20.

In this illustrative example, first metal contact 2102, second metal contact 2104 and layer of material 2106 may be formed as depicted by first metal contact 1802, second metal contact 1804, and layer of material 1806 in FIG. 18.

Plurality of photons 2108 travel through plastic optical fiber 2109 and are received by optical detector 2100. Plurality of photons 2108 pass through metal layer 2000 and enter into intrinsic region 1504. The absorption of plurality of photons 2108 into intrinsic region 1504 pushes electrons in intrinsic region 1504 downwards into substrate 1502 generating an electrical signal.

Raised portion 1902 reduces thickness 2110 of intrinsic region 1504. The thickness of intrinsic region 1504 directly beneath metal layer 2000 is larger than thickness 2110. Layer 1900 reduces the flow of electrons along surface 2112. Layer 1900 may provide less area present outside the portion of intrinsic region 1504 directly below metal layer 2000. Less area for electrons to flow along surface 2112 increases a flow of electrons toward substrate 1502. As a result, an electrical signal is generated with greater sensitivity to an input of plurality of photons 2108.

The illustrations provided in FIGS. 15-21 are not meant to imply physical or architectural limitations to the manner in which different advantageous embodiments can be implemented. For example, the sizes and dimensions in FIG. 15-21 may be increased or decreased depending on implementation. As another example, intrinsic region 1504 in FIG. 15 may be grown to levels of less than one micron for decreased size of the overall chip. Additionally, any type of semiconductor material may be used in the semiconductor device. For example, without limitation, intrinsic region 1504 and/or substrate 1502 may be comprised of silicon, germanium, gallium arsenide, indium gallium arsenide, indium phosphide, and/or any other suitable semiconductor material.

Figure 22:
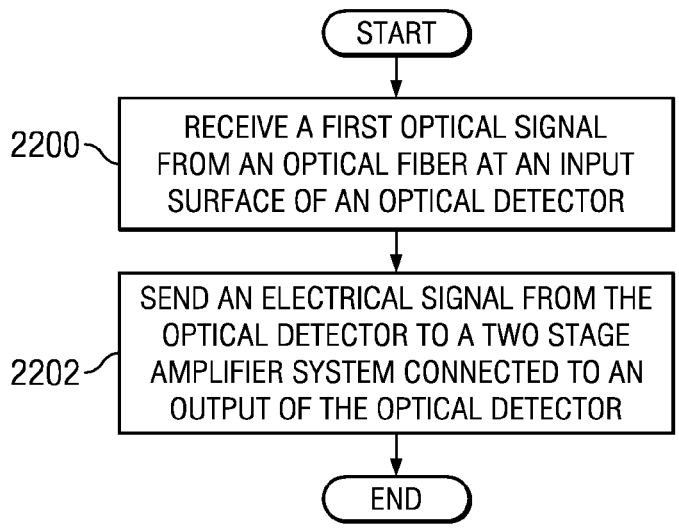
FIG. 22 is an illustration of a flowchart of a process for processing optical signals in accordance with an advantageous embodiment.

With reference now to FIG. 22, an illustration of a flowchart of a process for processing optical signals is depicted in accordance with an advantageous embodiment. The process illustrated in FIG. 22 may be implemented in an optical signal environment, such as optical signal environment 300 in FIG. 3.

The process begins by receiving a first optical signal from an optical fiber at an input surface of an optical detector (operation 2200). In operation 2200, the input surface of the optical detector may have a diameter that is substantially equal to a diameter of a core in the optical fiber. By having these two diameters be substantially equal, signal distortion and capacitance may be reduced.

The process sends an electrical signal from the optical detector to a two stage amplifier system connected to an output of the optical detector (operation 2202), with the process terminating thereafter. In operation 2202, the optical detector and the two stage amplifier system are connected to the output of the optical detector from an optical receiver. The optical receiver has a sensitivity having a value substantially equal to or less than about −32 decibel milliwatts.

Figure 23:
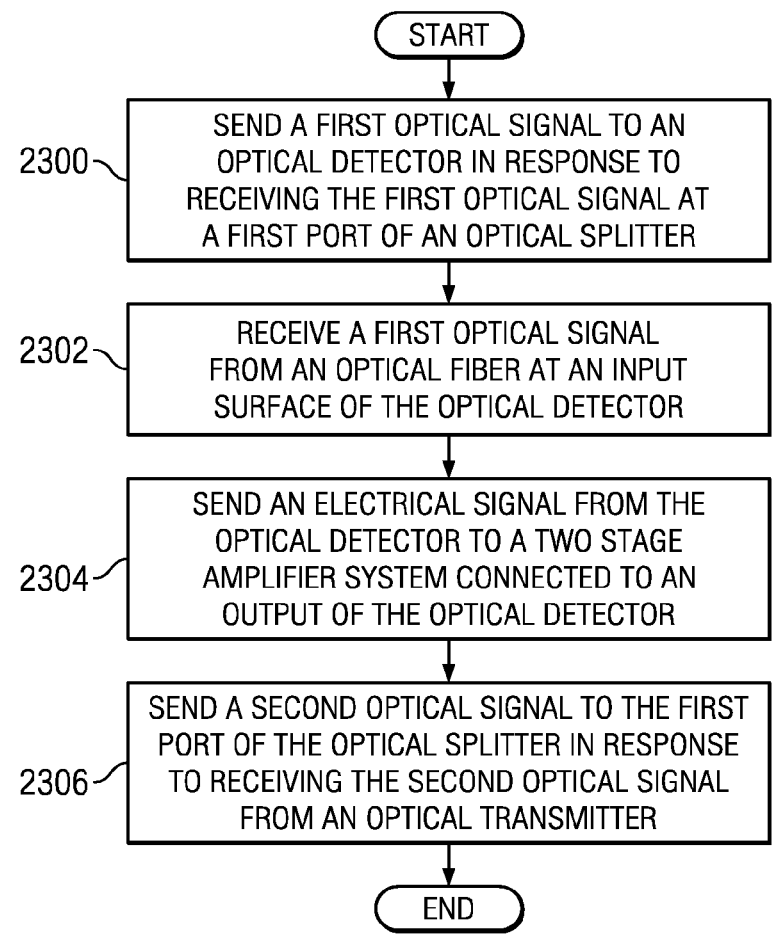
FIG. 23 is an illustration of a flowchart of a process for processing optical signals in accordance with an advantageous embodiment.

With reference now to FIG. 23, an illustration of a flowchart of a process for processing optical signals is depicted in accordance with an advantageous embodiment. The process illustrated in FIG. 23 may be implemented in an optical signal environment, such as optical signal environment 300 in FIG. 3.

The process begins by sending a first optical signal to an optical detector in response to receiving the first optical signal at a first port of an optical splitter (operation 2300). In operation 2300, the optical splitter may have a second port coupled to the optical detector. The optical splitter may send the first optical signal from the first port to the second port.

Thereafter, the process receives the first optical signal from an optical fiber at an input surface of the optical detector (operation 2302). In operation 2302 the input surface of the optical detector may have a diameter that is substantially equal to a diameter of a core in the plastic optical fiber. By having these two diameters be substantially equal, signal distortion and capacitance may be reduced.

The process sends an electrical signal from the optical detector to a two stage amplifier system connected to an output of the optical detector (operation 2304), with the process terminating thereafter. In operation 2304, the optical detector and the two stage amplifier system are connected to the output of the optical detector to form an optical receiver. The optical receiver has a sensitivity having a value substantially equal to or less than about −32 decibel milliwatts.

The process then sends a second optical signal to the first port of the optical splitter in response to receiving the second optical signal from an optical transmitter (operation 2306), with the process terminating thereafter. In operation 2306, the optical transmitter may be coupled to a third port of the optical splitter. The second optical signal may be generated by a light emitting diode of the optical transmitter.

Figure 24:
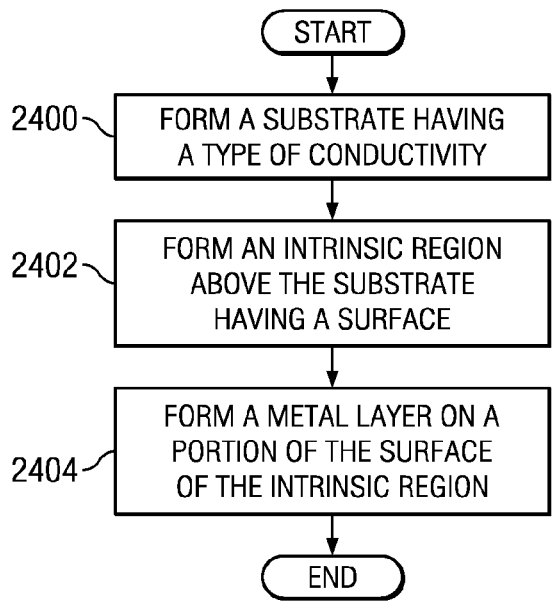
FIG. 24 is an illustration of a flowchart of a process for forming an optical detector in accordance with an advantageous embodiment.

With reference now to FIG. 24, an illustration of a flowchart of a process for forming an optical detector is depicted in accordance with an advantageous embodiment. The process illustrated in FIG. 24 may be implemented in an optical signal environment, such as optical signal environment 400 in FIG. 4.

The process begins by forming a substrate having a type of conductivity (operation 2400). In operation 2400, the substrate may be formed from semiconductor materials. The substrate may have an n-type of conductivity. Thereafter, the process forms an intrinsic region above the substrate having a surface (operation 2402).

In operation 2402, the intrinsic region has a surface. The intrinsic region may be formed by growing a layer of semiconductor material on the substrate. The intrinsic region may also be formed by depositing a layer of semiconductor material on the substrate and/or some other suitable methods.

The process then forms a metal layer on a portion of the surface of the intrinsic region (operation 2404) with the process terminating thereafter. In operation 2404, the metal layer has a thickness configured to allow a plurality of photons to pass through the metal layer into the intrinsic region and forms a rectifying contact with the intrinsic region. The metal layer may be formed by depositing the metal layer on the portion of the surface of the intrinsic region using photolithographic masks.

Figure 25:
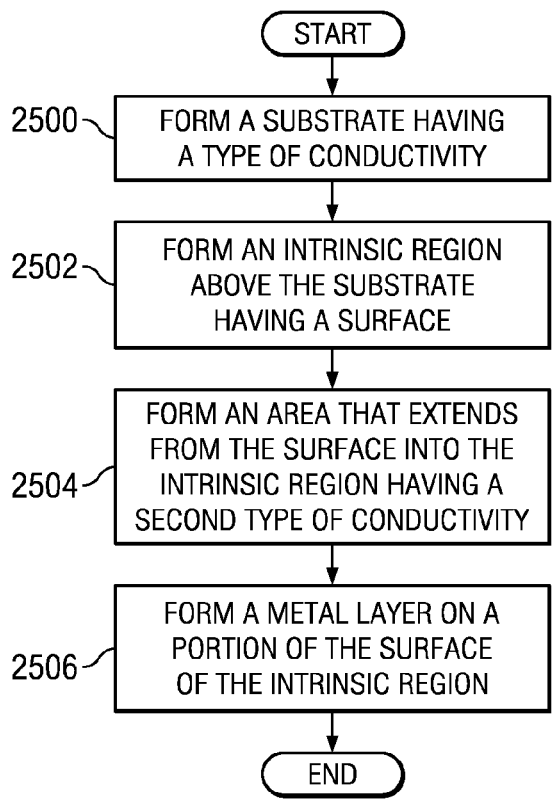
FIG. 25 is an illustration of a flowchart of a process for forming an optical detector in accordance with an advantageous embodiment.

With reference now to FIG. 25, an illustration of a flowchart of a process for forming an optical detector is depicted in accordance with an advantageous embodiment. The process illustrated in FIG. 25 may be implemented in an optical signal environment, such as optical signal environment 400 in FIG. 4.

The process begins by forming a substrate having a type of conductivity (operation 2500). In operation 2500, the substrate may be formed from semiconductor materials. The substrate may have an n-type of conductivity. The process forms an intrinsic region above the substrate having a surface (operation 2502).

In operation 2502 the intrinsic region has a surface. The intrinsic region may be formed by growing a layer of semiconductor material on the substrate. The intrinsic region may also be formed by depositing a layer of semiconductor material on the substrate and/or some other suitable methods.

Thereafter, the process forms an area that extends from the surface into the intrinsic region having a second type of conductivity (operation 2504). In operation 2504, the area surrounds a portion of the intrinsic region around the metal layer. The area may have a p-type of conductivity. The area may be configured to reduce a current moving across the surface outside of the intrinsic region surrounded by the area. The area may be formed by diffusing zinc into the surface of the intrinsic region. The area may also be formed by implanting ions into the intrinsic region using a particle accelerator.

The process then forms a metal layer on a portion of the surface of the intrinsic region (operation 2506), with the process terminating thereafter. In operation 2506, the metal layer has a thickness configured to allow a plurality of photons to pass through the metal layer into the intrinsic region and forms a rectifying contact with the intrinsic region. The metal layer may be formed by depositing the metal layer on the portion of the surface of the intrinsic region using photolithographic masks.

Figure 26:
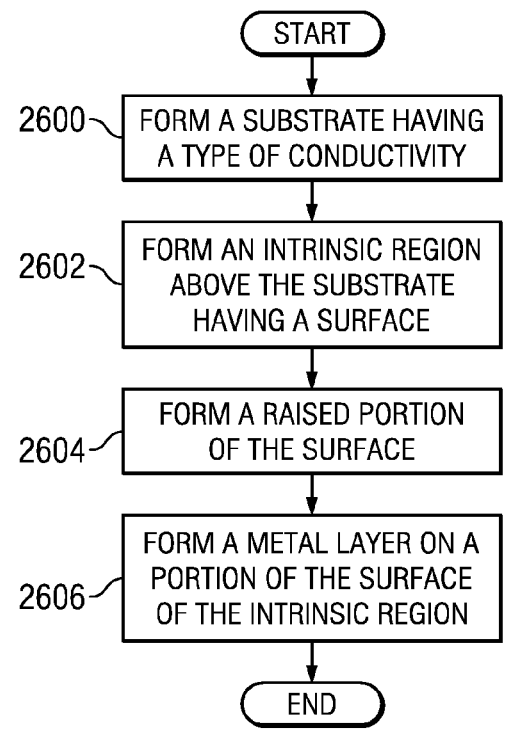
FIG. 26 is an illustration of a flowchart of a process for forming an optical detector in accordance with an advantageous embodiment.

With reference now to FIG. 26, an illustration of a flowchart of a process for forming an optical detector is depicted in accordance with an advantageous embodiment. The process illustrated in FIG. 26 may be implemented in an optical signal environment, such as optical signal environment 400 in FIG. 4.

The process begins by forming a substrate having a type of conductivity (operation 2600). In operation 2600, the substrate may be formed from semiconductor materials. The substrate may have an n-type of conductivity. The process forms an intrinsic region above the substrate having a surface (operation 2602).

In operation 2602, the intrinsic region has a surface. The intrinsic region may be formed by growing a layer of semiconductor material on the substrate. The intrinsic region may also be formed by depositing a layer of semiconductor material on the substrate and/or some other suitable methods.

Thereafter, the process forms a raised portion of the surface (operation 2604). The raised portion is configured to reduce a current moving across the surface outside of the raised portion. The raised portion may be formed by etching the surface of the intrinsic region.

The process then forms a metal layer on a portion of the surface of the intrinsic region (operation 2606), with the process terminating thereafter. In operation 2606, the metal layer has a thickness configured to allow a plurality of photons to pass through the metal layer into the intrinsic region and form an ohmic contact with the intrinsic region. The metal layer may be formed by depositing the metal layer on the portion of the surface of the intrinsic region using photolithographic masks.

The flowcharts and block diagrams in the different depicted embodiments illustrate the architecture, functionality, and operation of some possible implementations of apparatus and methods in different advantageous embodiments. In this regard, each block in the flowcharts or block diagrams may represent a module, segment, function, and/or a portion of an operation or step.

In some alternative implementations, the function or functions noted in the blocks may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

Thus, the different advantageous embodiments provide a method and apparatus for a transceiver for networks with plastic optical fibers. In one advantageous embodiment, an apparatus comprises an optical transmitter; an optical detector configured to receive optical signals from an optical fiber; an optical splitter having a first port, a second port coupled to the optical detector by the optical fiber, and a third port coupled to the optical transmitter; and a two stage amplifier system connected to an output of the optical detector. An input surface of the optical detector has a diameter that is substantially equal to a diameter of a core in the optical fiber.

The optical detectors depicted in the different advantageous embodiments increase a level of sensitivity for a transceiver for networks with plastic optical fibers. For example, the configuration of the diameter of the input surface of the optical detector reduces signal distortion and reduces capacitance. The raised portions and/or areas of the intrinsic region of the optical detectors increase a flow of electrons toward the substrate. This increased flow causes an output signal to be produced from the optical detector with greater sensitivity to the input signal received. Further, the configuration of the transceiver increases surface space savings and reduces bending of optical fibers.

The description of the different advantageous embodiments has been presented for purposes of illustration and description, and it is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
an optical transmitter;
an optical detector configured to receive optical signals from a plastic optical fiber, wherein an input surface of the optical detector has a diameter that is substantially equal to a diameter of a core in the optical fiber, wherein the diameter of the input surface of the optical detector reduces capacitance and reduces signal distortion, the optical detector further comprising: a Schottky barrier diode having a configuration comprising a substrate, an intrinsic region, a first metal layer, a second metal layer, and a third metal layer, wherein the intrinsic region comprises a layer of semiconductor material positioned on top of the substrate, the intrinsic region has substantially no dopants, the first metal layer is disposed on a portion of a surface of the intrinsic region, a junction between the first metal layer and the intrinsic region forms a depletion region, substantially all free electrons have been removed from the depletion region, an area that surrounds all or a part of the surface of the intrinsic region in contact with first metal layer, the area reducing a dark current, the area having a second type of conductivity, which is opposite a conductivity of the substrate, the second metal layer in contact with a surface of the substrate, and the third metal layer formed to be in contact with a portion of a surface of the first metal layer;
an optical splitter having a first port, a second port coupled to the optical detector by the optical fiber, and a third port coupled to the optical transmitter, wherein the optical splitter is configured to receive a first optical signal at the first port, wherein the optical splitter is configured to send the first optical signal to the second port and send a second optical signal received at the third port to the first port;
a two stage amplifier system connected to an output of the optical detector, the two stage amplifier comprising a first amplifier and a second amplifier, the first amplifier comprising a current to voltage converter, and the second amplifier comprising a limiting amplifier; and
a printed wiring board having a first surface and a second surface, wherein the optical detector is located on the first surface and the optical transmitter is located on the second surface such that the optical detector is located substantially opposite to the optical transmitter on the printed wiring board.

2. The apparatus of claim 1, wherein the optical detector and the two stage amplifier system connected to the output of the optical detector form an optical receiver and wherein the optical receiver has a sensitivity having a value equal to or less than −32 decibel milliwatts.

3. The apparatus of claim 1, wherein the optical transmitter comprises a light emitting diode and an amplifier and wherein the amplifier is configured to send a bias current and a modulation current to the light emitting diode.

4. The apparatus of claim 3, wherein the light emitting diode generates a signal having at least an average of about one milliwatt of optical power, and wherein the signal is coupled into an optical fiber.

5. The apparatus of claim 3, wherein the light emitting diode emits a signal having a wavelength selected from one of about 650 nanometers, about 500 nanometers, and about 450 nanometers.

6. The apparatus of claim 1, wherein the optical transmitter is configured to send the second optical signal to the third port.

7. The apparatus of claim 1, wherein the optical fiber is a first optical fiber and wherein the first port is configured to receive a second optical fiber.

8. The apparatus of claim 7, wherein the first optical fiber and the second optical fiber are selected from one of a plastic optical fiber and a glass optical fiber.

9. The apparatus of claim 1, wherein the first amplifier comprises a transimpedance amplifier.

10. The apparatus of claim 1, wherein the optical detector and the two stage amplifier system connected to the output of the optical detector form an optical receiver; the optical receiver has a sensitivity having a value equal to or less than −32 decibel milliwatts; the optical transmitter comprises a light emitting diode and an amplifier; the amplifier is configured to send a bias current and a modulation current to the light emitting diode; the light emitting diode generates a signal having at least an average of 1 milliwatt of optical power; the signal is coupled into an optical fiber; the light emitting diode emits a signal having a wavelength selected from one of about 650 nanometers, about 500 nanometers and about 450 nanometers; the optical transmitter is configured to send the second optical signal to the third port; the optical fiber is a first optical fiber; the first port is configured to receive a second optical fiber; the first optical fiber and the second optical fiber are selected from one of a plastic optical fiber and a glass optical fiber; the optical detector is selected from one of a diode having a p-type layer on an intrinsic layer on an n-type layer and a Schottky barrier diode configured to detect photons; and the two stage amplifier system comprises a transimpedance amplifier connected with a limiting amplifier.

11. An apparatus comprising:
an optical detector configured to receive optical signals from a plastic optical fiber, the optical fiber comprising a single core, wherein an input surface of the optical detector has a diameter that is substantially equal to a diameter of a core in the plastic optical fiber, wherein the diameter of the input surface of the optical detector reduces capacitance and reduces signal distortion, the optical detector further comprising: a Schottky barrier diode having a configuration comprising a substrate, an intrinsic region, a first metal layer, a second metal layer, and a third metal layer, wherein the intrinsic region comprises a layer of semiconductor material positioned on top of the substrate, the intrinsic region has substantially no dopants, the first metal layer is disposed on a portion of a surface of the intrinsic region, a junction between the first metal layer and the intrinsic region forms a depletion region, substantially all free electrons have been removed from the depletion region, an area that surrounds all or a part of the surface of the intrinsic region in contact with first metal layer, the area reducing a dark current, the area having a second type of conductivity, which is opposite a conductivity of the substrate, the second metal layer in contact with a surface of the substrate, and the third metal layer formed to be in contact with a portion of a surface of the first metal layer;

an optical splitter having a first port, a second port coupled to the optical detector by the optical fiber, and a third port coupled to an optical transmitter;

a two stage amplifier system connected to an output of the optical detector to form an optical receiver, wherein the optical receiver has a sensitivity having a value of equal to or less than −32 decibel milliwatts; and a substantially planar printed wiring board having a first surface and a second surface, wherein the optical detector is located on the first surface and the optical transmitter is located on the second surface such that the optical detector is located substantially opposite to the optical transmitter on the printed wiring board.

12. The apparatus of claim 11, wherein the two stage amplifier system comprises a transimpedance amplifier connected with a limiting amplifier.

13. A method for processing optical signals, the method comprising:

receiving a first optical signal from an optical fiber at an input surface of an optical detector, wherein the input surface of the optical detector has a diameter that is substantially equal to a diameter of a core in the optical fiber, wherein the diameter of the input surface of the optical detector reduces capacitance and reduces signal distortion, the optical detector further comprising: a Schottky barrier diode having a configuration comprising a substrate, an intrinsic region, a first metal layer, a second metal layer, and a third metal layer, wherein the intrinsic region comprises a layer of semiconductor material positioned on top of the substrate, the intrinsic region has substantially no dopants, the first metal layer is disposed on a portion of a surface of the intrinsic region, a junction between the first metal layer and the intrinsic region forms a depletion region, substantially all free electrons have been removed from the depletion region, an area that surrounds all or a part of the surface of the intrinsic region in contact with first metal layer, the area reducing a dark current, the area having a second type of conductivity, which is opposite a conductivity of the substrate, the second metal layer in contact with a surface of the substrate, and the third metal layer formed to be in contact with a portion of a surface of the first metal layer;

sending an electrical signal from the optical detector to a two stage amplifier system connected to an output of the optical detector, wherein the optical detector and the two stage amplifier system form an optical receiver and wherein the optical receiver has a sensitivity having a value equal to or less than −32 decibel milliwatts; and responsive to receiving the first optical signal at a first port of an optical splitter having a second port coupled to the optical detector and a third port coupled to an optical transmitter, sending the first optical signal to the second port, the optical detector located on the first surface of a printed wiring board and the optical transmitter located on a second surface of the printed wiring board such that the optical detector is located substantially opposite to the optical transmitter on the printed wiring board.

14. The method of claim 13, further comprising:

responsive to receiving a second optical signal from the optical transmitter at the third port, sending the second optical signal to the first port.

15. The method of claim 14, further comprising:

sending a bias current and a modulation current by a driver amplifier to a light emitting diode of the optical transmitter; and generating the second optical signal by the light emitting diode.

16. The method of claim 15, wherein the step of generating the second optical signal by the light emitting diode comprises:

generating the second optical signal by the light emitting diode, wherein the light emitting diode generates a signal having at least an average of about one milliwatt of optical power, wherein the signal is coupled into an optical fiber.

17. The method of claim 13, wherein the step receiving the first optical signal from the optical fiber at the input surface of the optical detector comprises:

receiving the first optical signal from the optical fiber at the input surface of the optical detector, wherein the optical fiber is a plastic optical fiber.

18. The method of claim 13, wherein the step of sending the electrical signal from the optical detector to the two stage amplifier system connected to the output of the optical detector comprises:

sending the electrical signal from the optical detector to the two stage amplifier system connected to the output of the optical detector, wherein the two stage amplifier system comprises a transimpedance amplifier connected with a limiting amplifier.

19. The apparatus of claim 1, further comprising a first housing, wherein the optical detector is located in the first housing.

20. The apparatus of claim 19, further comprising a second housing, wherein the optical transmitter is located in the second housing.

21. The apparatus of claim 20, wherein the first housing and the second housing comprise hermetically sealed containers.

22. The apparatus of claim 19, wherein the first amplifier is located within first housing.

23. The apparatus of claim 1, wherein the optical splitter further comprises a first arm and a second arm, the first arm positioned the first surface and the second arm positioned on the second surface.

24. The apparatus of claim 1, wherein the printed wiring board is substantially planar.

* * * * *